United States Patent
Agrawal et al.

(10) Patent No.: US 6,216,257 B1
(45) Date of Patent: Apr. 10, 2001

(54) FPGA DEVICE AND METHOD THAT INCLUDES A VARIABLE GRAIN FUNCTION ARCHITECTURE FOR IMPLEMENTING CONFIGURATION LOGIC BLOCKS AND A COMPLIMENTARY VARIABLE LENGTH INTERCONNECT ARCHITECTURE FOR PROVIDING CONFIGURABLE ROUTING BETWEEN CONFIGURATION LOGIC BLOCKS

(75) Inventors: Om P. Agrawal, Los Altos; Herman M. Chang, Cupertino; Bradley A. Sharpe-Geisler, San Jose; Giap H. Tran, San Jose; Bai Nguyen, San Jose, all of CA (US)

(73) Assignee: Vantis Corporation, San Jose, CA (US)

(*) Notice: Subject to any disclaimer, the term of this patent is extended or adjusted under 35 U.S.C. 154(b) by 0 days.

(21) Appl. No.: 09/603,807

(22) Filed: Jun. 26, 2000

Related U.S. Application Data

(63) Continuation of application No. 09/008,762, filed on Jan. 19, 1998, now Pat. No. 6,130,551, and a continuation-in-part of application No. 09/472,645, filed on Dec. 27, 1999, now Pat. No. 6,150,842, which is a continuation of application No. 08/948,306, filed on Oct. 9, 1997, now Pat. No. 6,097,212.

(51) Int. Cl.[7] .............................. G06F 17/50; G06F 7/38; H03K 17/693; H03K 19/177
(52) U.S. Cl. ................................ 716/16; 326/41; 326/39; 716/12; 716/17
(58) Field of Search ...................... 326/39, 41; 716/12, 716/16, 17

(56) References Cited

U.S. PATENT DOCUMENTS

| | | | | |
|---|---|---|---|---|
| 5,499,192 | * | 3/1996 | Knapp et al. | 716/17 |
| 5,659,484 | * | 8/1997 | Bennett et al. | 716/16 |
| 5,900,743 | * | 5/1999 | McClintock et al. | 326/41 |
| 6,086,629 | * | 7/2000 | McGettigan et al. | 716/12 |
| 6,100,715 | * | 8/2000 | Agrawal et al. | 326/39 |
| 6,130,551 | * | 10/2000 | Agrawal et al. | 326/39 |

OTHER PUBLICATIONS

Howard, Neil, Tyrrell, Andrew, and Allinson, Nigel, "The Yield Enhancement of Field–Programmable Gate Arrays", IEEE Transactions on VLSI Systems, vol. 2, Mar. 1994, pp. 115–123.*

* cited by examiner

Primary Examiner—Matthew Smith
Assistant Examiner—Jibreel Speight
(74) Attorney, Agent, or Firm—Fliesler, Dubb, Meyer & Lovejoy LLP

(57) ABSTRACT

A field-programmable gate array device (FPGA) having plural rows and columns of logic function units is organized with symmetrical and complementary Variable Grain Architecture (VGA) and Variable Length Interconnect Architecture (VLI). Synthesis mapping exploits the diversified and symmetric resources of the VGA and VLI to efficiently pack function development into logic units of matched granularity and to transfer signals between logic units with interconnect lines of minimal length.

10 Claims, 23 Drawing Sheets

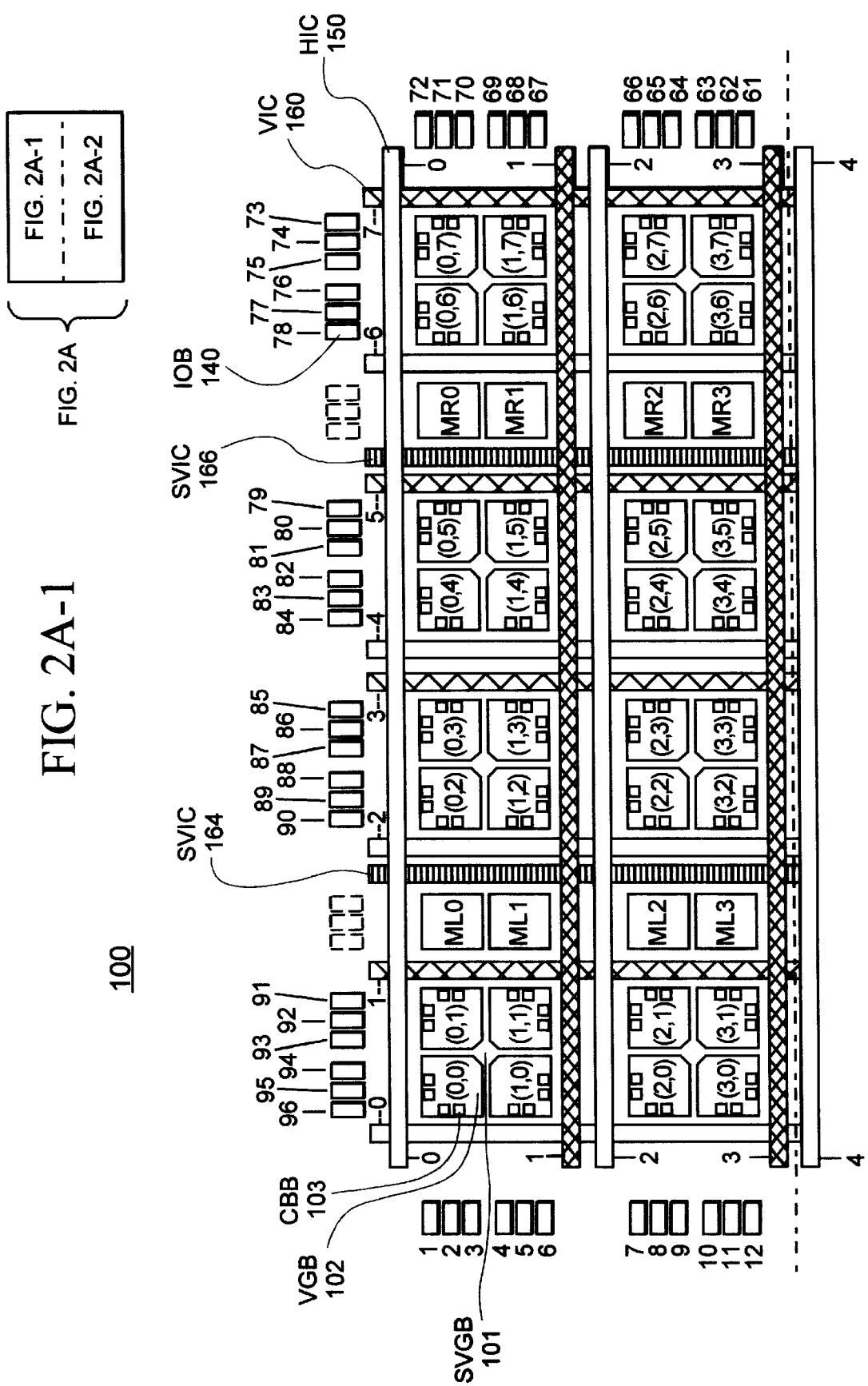

FPGA DEVICE AND METHOD THAT INCLUDES A VARIABLE GRAIN FUNCTION ARCHITECTURE FOR IMPLEMENTING CONFIGURATION LOGIC BLOCKS AND A COMPLIMENTARY VARIABLE LENGTH INTERCONNECT ARCHITECTURE FOR PROVIDING CONFIGURABLE ROUTING BETWEEN CONFIGURATION LOGIC BLOCKS

CROSS REFERENCE TO RELATED APPLICATIONS

This application continues from U.S. Ser. No. 09/008,762, filed Jan. 19, 1998, now U.S. Pat. No. 6,130,551. This application also continues-in-part from Ser. No. 09/472,645, now U.S. Pat. No. 6,150,842, filed Dec. 27, 1999, which continued from U.S. Ser. No. 08/948,306, filed Oct. 9, 1997, now U.S. Pat. No. 6,097,212. This disclosures of said applications are incorporated herein by reference.

The following copending U.S. patent application(s) is/are assigned to the assignee of the present application, and its/their disclosures is/are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(C) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(D) Ser. No. 08/995,614 filed Dec. 22, 1997, by On Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(E) Ser. No. 08/995,612 filed Dec. 22, 1997, by Om Agrawal et al. and originally entitled, "FLEXIBLE DIRECT CONNECTIONS BETWEEN INPUT/OUTPUT BLOCKS (IOBs) AND VARIABLE GRAIN BLOCKs (VGBs) IN FPGA INTEGRATED CIRCUITS";

(F) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS"; and (G) Ser. No. 08/996,049 filed Dec. 22, 1997, by Om Agrawal et al. and originally entitled, "DUAL PORT SRAM MEMORY FOR RUN-TIME USE IN FPGA INTEGRATED CIRCUITS".

BACKGROUND

1. Field of the Invention

The invention is generally directed to integrated circuits, more specifically to on-chip user-configurable interconnect provided for run-time use within Programmable Logic Devices (PLD's), and even more specifically to a subclass of PLD's known as Field Programmable Gate Arrays (FPGA's) and methods for configuring the same to implement synthesized circuitry.

2. Cross Reference to Related Patents

The following U.S. patent(s) are assigned to the assignee of the present application, and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMALE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

3. Description of Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has grown along a paradigm known as Complex PLD's or CPLD's. This paradigm is characterized by devices such as the Advanced Micro Devices MACH™ family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGA's. Examples of such devices include the XC2000™ and $XC_{3000}$™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reProgrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means. Typically, each of the many CLB's of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect. A version of hard wired interconnect wherein a given conductor is dedicatedly connected to be always driven by a particular output driver, is sometimes referred to as 'direct connect'.

In addition to the above-mentioned basic components, it is sometimes desirable to include on-chip reprogrammable memory that is embedded between CLB's and available for run-time use by the CLB's and/or resources of the FPGA for temporarily holding storage data. This embedded run-time memory is to be distinguished from the configuration memory because the latter configuration memory is generally not reprogrammed while the FPGA device is operating in a run-time mode. The embedded run-time memory may be used in speed-critical paths of the implemented design to implement, for example, FIFO or LIFO elements that buffer data words on a first-in/first-out or last-in/first-out basis. Read/write speed and appropriate interconnecting of such on-chip embedded memory to other resources of the FPGA can limit the ability of a given FPGA architecture to implement certain speed-critical designs.

Modern FPGA's tend to be fairly complex. They typically offer a large spectrum of user-configurable options with respect to how each of many CLB's should be configured, how each of many interconnect resources should be configured, and how each of many IOB's should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

FPGA-configuring software typically cycles through a series of phases, referred to commonly as 'partitioning', 'placement', and 'routing'. This software is sometimes referred to as a 'place and route' program. Alternate names may include, 'synthesis, mapping and optimization tools', where synthesis refers to use of high level design tools such as VHDL or Verilog™ and mapping refers to the translation of synthesis design definitions into terms applicable to a target FPGA.

In the partitioning phase, an original circuit design (which is usually relatively large and complex) is divided into smaller chunks, where each chunk is made sufficiently small to be implemented by a single CLB, the single CLB being a yet-unspecified one of the many CLB's that are available in the yet-unprogrammed FPGA device. Differently designed FPGA's can have differently designed CLB's with respective logic-implementing resources. As such, the maximum size of a partitioned chunk can vary in accordance with the specific FPGA device that is designated to implement the original circuit design. The original circuit design can be specified in terms of a gate level description, or in Hardware Descriptor Language (HDL) form or in other suitable form.

After the partitioning phase is carried out, each resulting chunk is virtually positioned into a specific, chunk-implementing CLB of the designated FPGA during a subsequent placement phase.

In the ensuing routing phase, an attempt is made to algorithmically establish connections between the various chunk-implementing CLB's of the FPGA device, using the interconnect resources of the designated FPGA device. The goal is to reconstruct the original circuit design by reconnecting all the partitioned and placed chunks.

If all goes well in the partitioning, placement, and routing phases, the FPGA configuring software will find a workable 'solution' comprised of a specific partitioning of the original circuit, a specific set of CLB placements and a specific set of interconnect usage decisions (routings). It can then deem its mission to be complete and it can use the placement and routing results to generate the configuring code that will be used to correspondingly configure the designated FPGA.

In various instances, however, the FPGA configuring software may find that it cannot complete its mission successfully on a first try. It may find, for example that the initially-chosen placement strategy prevents the routing phase from completing successfully. This might occur because signal routing resources have been exhausted in one or more congested parts of the designated FPGA device. Some necessary interconnections may have not been completed through those congested parts. Alternatively, all necessary interconnections may have been completed, but the FPGA configuring software may find that simulation-predicted performance of the resulting circuit (the so-configured FPGA) is below an acceptable threshold. For example, signal propagation time may be too large in a speed-critical part of the FPGA-implemented circuit.

In either case, if the initial partitioning, placement and routing phases do not provide an acceptable solution, the FPGA configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the FPGA-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. FPGA configuring programs typically try to explore a multitude of promising avenues within a finite amount of time to see what effects each partitioning, placement, and routing move may have on the ultimate outcome. This in a way is analogous to how chess-playing machines explore ramifications of each move of each chess piece on the end-game. Even when relatively powerful, high-speed computers are used, it may take the FPGA configuring software a significant amount of time to find a workable solution. Turn around time can take more than 8 hours.

In some instances, even after having spent a large amount of time trying to find a solution for a given FPGA-implementation problem, the FPGA configuring software may fail to come up with a workable solution and the time spent becomes lost turn-around time. It may be that, because of packing inefficiencies, the user has chosen too small an FPGA device for implementing too large of an original circuit.

Another possibility is that the internal architecture of the designated FPGA device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. Another example is 'control logic' which is less random than fully 'random logic' but less regular than 'bus oriented' designs. There may be many more taxonomical descriptions. The point is that some FPGA structures may be better suited for implementing random logic while others may be better suited for implementing bus oriented designs or other kinds of designs.

If the FPGA configuring software fails in a first run, the user may choose to try again with a differently-structured FPGA device. The user may alternatively choose to spread the problem out over a larger number of FPGA devices, or even to switch to another circuit implementing strategy such as CPLD or ASIC (where the latter is an Application Specific hardwired design of an IC). Each of these options invariably consumes extra time and can incur more costs than originally planned for.

FPGA device users usually do not want to suffer through such problems. Instead, they typically want to see a fast turnaround time of no more than, say 4 hours, between the time they complete their original circuit design and the time a first-run FPGA is available to implement and physically test that design. More preferably, they would want to see a fast turnaround time of no more than, say 30 minutes, for successful completion of the FPGA configuring software when executing on a 80486–80686 PC platform (that is, a so-commercially specified, IBM compatible personal computer) and implementing a 25000 gate or less, design in a target FPGA device.

FPGA users also usually want the circuit implemented by the FPGA to provide an optimal emulation of the original design in terms of function packing density, cost, speed, power usage, and so forth irrespective of whether the original design is taxonomically describable generally as 'random logic', or as 'bus oriented', or as a combination of these, or otherwise.

When multiple FPGA's are required to implement a very large original design, high function packing density and efficient use of FPGA internal resources are desired so that implementation costs can be minimized in terms of both the number of FPGA's that will have to be purchased and the amount of printed circuit board space that will be consumed.

Even when only one FPGA is needed to implement a given design, a relatively high function packing density is still desirable because it usually means that performance speed is being optimized due to reduced wire length. It also usually means that a lower cost member of a family of differently sized FPGA's can be selected or that unused resources of the one FPGA can be reserved for future expansion needs.

In summary, end users want the FPGA configuring software to complete its task quickly and to provide an efficiently-packed, high-speed compilation of the functionalities provided by an original circuit design irrespective of the taxonomic organization of the original design.

In the past, it was thought that attainment of these goals was primarily the responsibility of the computer programmers who designed the FPGA configuring software. It has been shown however, that the architecture or topology of the unprogrammed FPGA can play a significant role in determining how well and how quickly the FPGA configuring software completes the partitioning, placement, and routing tasks.

The architectural granularity, diversity, and implementation of on-chip interconnect resources can also play a role in how well the FPGA configuring software is able to complete the partitioning, placement and routing tasks with respect to using interconnect; and also how well the FPGA-implemented circuit performs in terms of propagating signals into, through and out of the FPGA chip.

SUMMARY OF THE INVENTION

An improved FPGA device in accordance with the invention includes both a Variable Grain Function Architecture ('VGFA', also referred to herein as 'VGA')) for implementing CLB's and a complementary Variable Length Interconnect Architecture ('VLIA', also referred to as 'VLI') for providing configurable routings between CLB's.

The Variable Length Interconnect Architecture (VLIA) comprises diversified interconnect resources of different lengths and timings distributed symmetrically with respect to orthogonal directions and with respect to the CLB's. (CLB's are granulatable into a spectrum of constructs that are defined herein from small to large as, CBB's, VGB's and SVGB's.) The symmetric, orthogonal sets of interconnect resources include nibble and/or word-wide busses for providing intra-VGB connections (within the VGB connections) and for providing inter-VGB connections and for providing IO connections. The symmetrically-distributed and diversified mesh of interconnect resources accommodates the placement pull of high level synthesis software while allowing optimization tools to route so as to provide for minimized wire lengths and maximized packings of logic functions into the granulatable CLB's (SVGB's, VGB's or CBB's) of the Variable Grain Function Architecture (VGA).

In one embodiment, the diversified interconnect resources include: (1) local feedback lines (FBL's) for interconnecting adjacent CBB's (Configurable Building Blocks) within each VGB (Variable Grain Block) of an SVGB tile structure; (2) direct connect lines (DCL's) for interconnecting VGB's of a symmetrical cross-hair structure (one central VGB and two neighboring VGB's for each of the north, east, south and west directions extending from the central VGB); (3) double length lines (2xL lines) which span the distance of two adjacent VGB's in either a horizontal or vertical direction; (4) quad length lines (4xL lines) which span the distance of four successive VGB's in either a horizontal or vertical direction; (5) octal length lines (8xL lines) which span the distance of eight successive VGB's in either a horizontal or vertical direction; (6) maximum length lines (MaxL lines) which span the distance of the maximum number of available successive VGB's in either a horizontal or vertical direction; (7) transmission bootstrapping switchboxes that provide user-configurable routing continuations at respective terminal ends of the 2xL through 8xL lines to same or other types of interconnect resources; and (8) global clock and global set/reset lines for globally broadcasting clock and set/reset signals throughout the FPGA device.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1A:
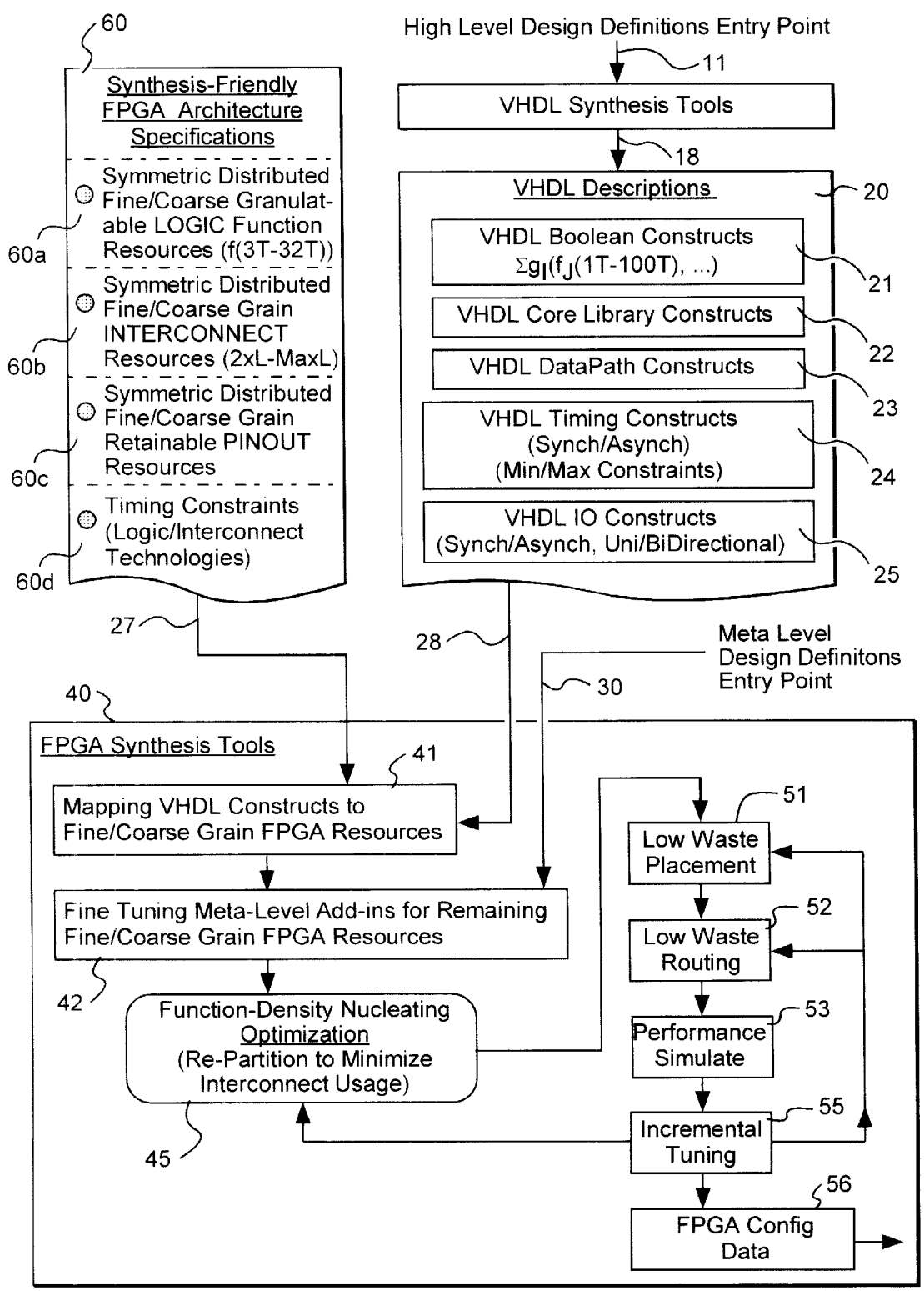
FIG. 1A diagrams a synthesis-friendly method for configuring an FPGA in accordance with the invention.

Modern circuit design typically starts with a Very High-level Descriptor Language (VHDL) or the like for defining the behavior of a to-be-implemented design at a level that is significantly higher than a gate-level or transistor level description. FIG. 1A shows a design flow 10 in accordance with the present invention. High level design definitions are entered at entry point 11 by designers into computer-implemented programs that are commonly referred to as VHDL synthesis tools 15. The output 18 of the VHDL synthesis tools 15 may be in the form of one or more files 20 that constitute VHDL descriptions of the to-be-implemented design.

The combined VHDL descriptions 20 may include one or more constructs including VHDL Boolean constructs 21 that define part or all of the design as a collection of hierarchical Boolean functions where any given function may have any number of independent input parameters. The complexity of the Boolean functions can span a spectrum having very simple ones (e.g., those having 1–3 input terms) at one end to very complex ones (e.g., those having 16 or more input terms) at the other end. The mix in terms of numbers of simple and complex functions can vary.

FIG. 1A provides an example wherein the spectrum of input parameters for a given function, f( . . . ), is anywhere from one input term (1T) to one hundred independent input terms (100T). The function f(1T–100T) may be called upon as at least one input parameter for a higher level function g( . . . ), where g( ) may itself have from one to 100 or more such input parameters. The identifier, $\Sigma g_i(f_j(1T-100T), \ldots$ ) in box 21 of FIG. 1A represents a numerous collection of such interdependent functions, $g_i$, $f_j$, and so on, each having one, two or more input terms or input parameters.

It is understood that each Boolean function having m output bits and n input terms may be implemented with m lookup tables (LUT's) each outputting a respective one bit and each having n independent input term receiving terminals. If a coarser-grained, 4-input LUT is used to implement a function of only 3 input terms, such would constitute wastage of part of the 4-input LUT. On the other hand, usage of three, finer-grained, 3-input LUT's to implement a 4-input function, where the three LUT's are intercoupled by configurable interconnect resources so as to implement the function of 4 input terms (where the f(3T) output of the first two LUT's become respective first and second inputs of the third LUT) may constitute wastage of both interconnect resources and LUT resources.

The VHDL descriptions 20 may further include VHDL core library constructs 22 that define non-Boolean functionalities. An example could be a sequential state machine such as a 16-bit counter.

The VHDL descriptions 20 may further include VHDL data path constructs 23 that define repetitive use of a same construct so as to implement N-bit wide data paths and data processing constructs; where N is an integer greater than 1. An example could be an 8-bit outputting multiplexer that receives N 8-bit words (N bytes) as inputs and outputs a selected one of the words; where N is an integer greater than 1.

The VHDL descriptions 20 may further include timing constructs 24 that define whether various signals are synchronous or asynchronous with respect to various clocks. Example could include clock-synchronized registers and tri-stated buses. The timing constructs 24 may further set forth minimum and maximum timing constraints for various signals.

The VHDL descriptions 20 may additionally include input/output constructs 25 that define the pinouts of the to-be-implemented device and define whether each pin is synchronous or asynchronous and unidirectional or bidirectional (tri-stateable).

Line 28 represents the transfer in FIG. 1A of the VHDL descriptions 20 to another set of computer programs 40 that are commonly referred to as 'FPGA synthesis tools'. Until this stage, the designer has not committed to using a specific technology for physically realizing the synthesized design. If the designer wishes to use one or more field programmable gate arrays, the designer will typically identify at this stage, the specific FPGA or family of FPGA devices that are to physically implement the VHDL-described design 20. Data flow path 27 represents the transfer in FIG. 1A of the identified architecture specifications 60 of the targeted FPGA to the FPGA synthesis tools 40.

At step 41, the VHDL constructs 28 are 'mapped' to the fine and/or coarse grain resources of the targeted FPGA device/family, where the latter is defined by data set 60.

As shown at 60a within box 60, the FPGA architecture specifications may define a certain spectrum of fine and coarsely granulated logic function resources. In one preferred embodiment, these variable grain resources include capabilities to implement Boolean functions with anywhere between three independent input terms (f(3T)) to as many as 32 or more independent terms (f(32T+)) within a symmetrical distribution of nucleated logic structures of the FPGA device. Such variable-grain, nucleated logic structures are described as variable grain blocks (VGB's) and super variable grain blocks (SVGB's) in the above-cited Ser. No. 08/948,306, which disclosure is incorporated herein by reference. The advantage of this Variable Grain Architecture is that simple functions such as f(3T) do not need to be wastefully implemented in LUT's having a fixed number of 4 or more inputs. On the other hand, more complex functions such as f(4T), f(5T), . . . f(32T) can be efficiently implemented in nucleated structures without unnecessarily consuming interconnect resources.

As shown at 60b within box 60, the FPGA architecture specifications may further define a spectrum of fine and/or coarsely granulated set of interconnect resources. An introduction to such symmetrically-distributed resources of variable length was provided in the above-cited Ser. No. 08/948, 306. A more detailed description will be provided herein. Each interconnect wire has a respective length; a respective, effective cross sectional area; it is made of materials of respective resistivities (metal layer materials and inter-layer via materials); and it is bounded by further materials of respective dielectric constants (insulators). As a result, the diversified interconnect resources of the FPGA provide different signal propagation capabilities.

For short-distance routing at high speed, interconnect resources identified herein as direct connect lines (DCL's), feedback lines (FBL's) and double length lines (2xL) may be used. Longlines (MaxL lines) may be used for tri-stateable broadcasting of signals across the FPGA device. Combinations of switchboxes and intermediate-haul length lines such as 4xL and 8xL may be further used. In one embodiment, core data path speeds of as high as 250 MHz may be obtained using the interconnect resources characterized in Table-1. Interconnect specifications such as those of Table-1 may be defined in area 60b.

TABLE 1

| Resource | Capacitance (pF) | Resistance (ohms) | RC (pΩF) |
|---|---|---|---|
| FBL | 0.20 | 30 | 6 |
| DCL | 0.90 | 40 | 36 |
| PIP (SwBox) | 0.04 | 280 | 11.2 |
| 2xL | 0.36 | 100 | 36 |
| 4xL | 0.61 | 200 | 122 |
| 8xL | 1.22 | 400 | 488 |
| MaxL | 3.00 | 600 | 1800 |

Note that the RC time constant of each 8xL line is about 4 times less than that of each MaxL line. If a signal needs to be broadcast over a distance of four or more 8xL lines, the MaxL line becomes a faster path (and does not consume switchboxes). Note further that the RC time constant of each 4xL line is about 4 times less than that of each 8xL line. So the same basic point of better efficiency is reached for switching from use of consecutive 4xL lines to an 8xL line when the number of 4xL lines is 4 or more. Note yet further that the RC time constant of each 2xL line is about 3 times less than that of each 4xL line. The RC sum of three 2xL lines and two intervening switchbox PIPs is about 130 pΩF (pico ohm farads). The RC of one 4xL line is less. In one embodiment, a 2xL line and its drive amplifier correspond to a time delay of about 1 nanosecond. Although FBL's have the smallest RC time constant, they also are driven by gates of relatively small fanout. On the other hand, DCL's are each driven by drive amplifiers with a substantially greater fanout (lower output series resistance). In one embodiment, the signal propagation times via an FBL or a DCL is about the same, around one nanosecond or less.

For purposes of signal input and output to/from the FPGA device, various types of pinbut resources may be provided as data bus groups or individual input or output pins. These FPGA characterizations may be specified in area 60c. In one embodiment, IOB's provide external bus speeds of as high as 160 MHZ at a user-selectable Vcc of 5V or 3.3V. The IOB's couple to a chip core section that operates at a lower voltage swing of 0V-to-2.5V. Pin-to-pin data transfer speeds can be as low as 6 nS (nanoseconds). Multiple paths of same propagation delay are provided between each of symmetrically distributed IOB's and different parts of the core so as to provide for an effective floating rotationability of the pins relative to the core. Such effective floating rotationability of IC pins relative to a chip core is described in the above cited U.S. Pat. No. 5,621,650 (PROGRAMMABLE LOGIC DEVICE WITH INTERNAL TIME-CONSTANT MULTIPLEXING OF SIGNALS FROM EXTERNAL INTERCONNECT BUSES). A specific type of IOB with dendrite extensions to multiple interconnect channels is described in above cited, Ser. No. 08/995,614 ("INPUT/OUTPUT BLOCK (IOB) CONNECTIONS TO MAXL LINES, NOR LINES AND DENDRITES IN FPGA INTEGRATED CIRCUITS"). The user-configurable, symmetric routing resources of such IOB's may be used to provide time-constant multiplexing for floating rotationability of packaging pins, or 'pin retention' as the concept may be referred to in later publications.

As shown at 60d within box 60, the FPGA architecture specifications may further define a set of technology specifications for components within the FPGA device. Signal propagation through the FPGA device will vary based on the technologies used to implement transistors of the logic sections, wires of the interconnect section and line drivers that drive signals onto the various lines of different length, surface area, resistivity and capacitance within the FPGA device. In one embodiment, a CMOS SRAM technology process is used to provide transistors with an effective channel length (Leff) of 0.18 micron and to further provide at least 4 metal layers (aluminum) for implementing interconnect wires. Wire RC is of course a combined function of many factors including surface area (which leads to parasitic capacitance) and cross sectional area (which defines resistance) and wire length.

Referring to the FPGA synthesis process of box 40 in FIG. 1A, mapping step 41 is typically used to alter the expressions 28 of the VHDL descriptions to match those of the FPGA specifications 60. Overly-large constructs of the VHDL descriptions 120 (e.g., large functions of the form f(100T)) should be reduced into smaller constructs (e.g., f(3T), f(4T), . . . , f(32T)) that may be more efficiently handled by the fine and/or coarsely grained logic function resources 60a of the FPGA architecture. Methods for providing nucleated function structures that provide a spectrum of function-implementing capabilities in the range f(3T) through f(32T) may be found in the above cited, Ser. No. 08/948,306 ("VARIABLE GRAIN ARCHITECTURE FOR FPGA INTEGRATED CIRCUITS").

After the VHDL descriptions 20 have been mapped to the fine/coarse grain FPGA resources (step 41), there may be unused resources still left in the targeted FPGA device. Entry point 30 represents a meta-level entry point by way of which designers can add further design specifications for additional functions into the FPGA synthesis tools 40. Step 42 represents the combining of these meta-level design definitions 30 with the mapped-VHDL constructs of step 41. If desired, the order in which meta-level design definitions and VHDL design definitions are entered may be reversed, with the VHDL constructs consuming left-over resources after the meta-level design definitions are entered and mapped to a virgin FPGA.

Step 45 of FIG. 1A is an optimization step that will be explained by referring to FIGS. 1B and 1C.

Large functions (e.g., f(100T)) may be implemented by cascading together many smaller logic functions (e.g., f(4T)) using intermediate interconnect resources. However, such cascading together of smaller function units may disadvantageously increases signal propagation time due to the additive delays of interconnect resources and logic function resources.

Figure 1B:
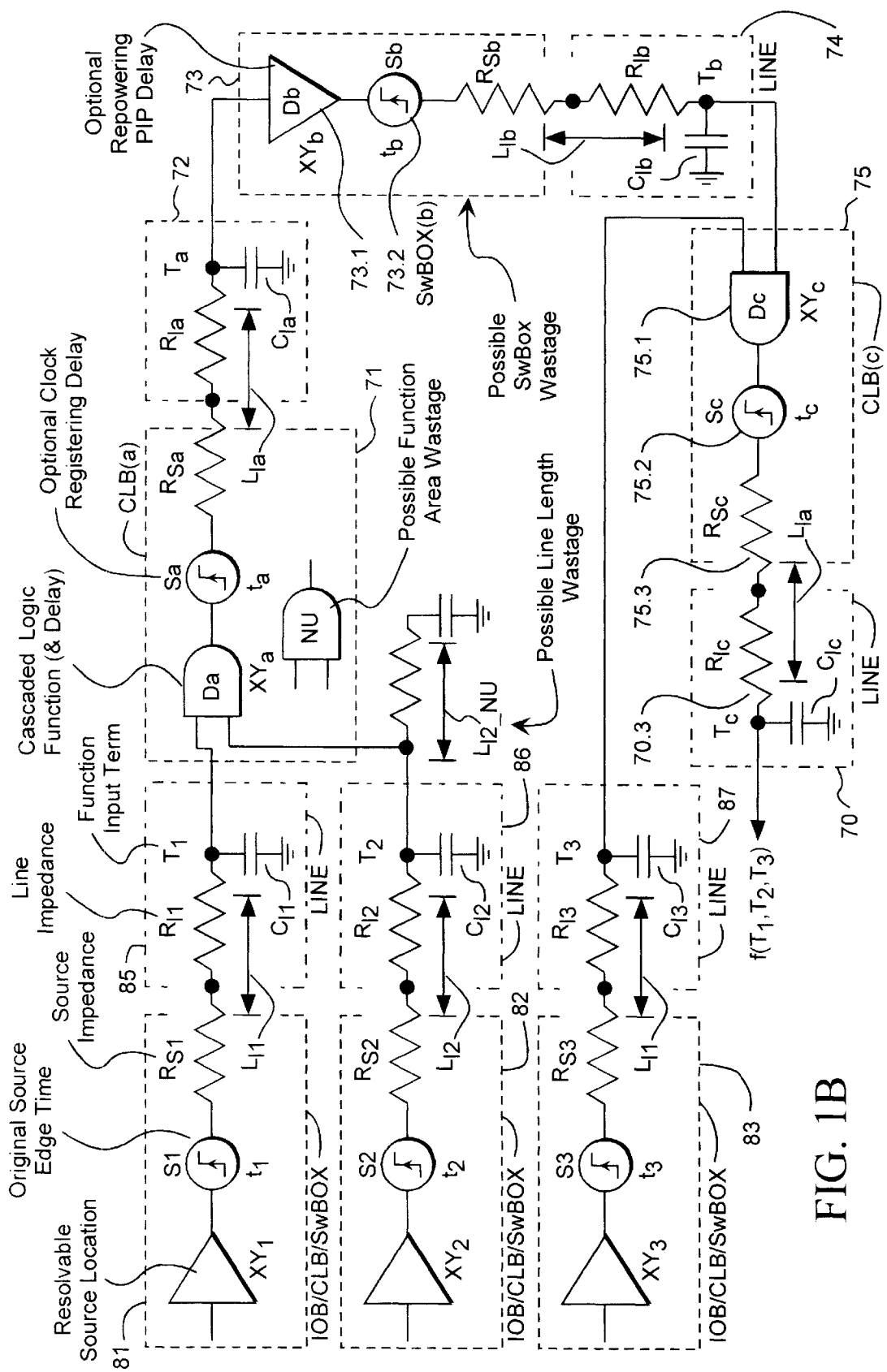
FIG. 1B is an equivalent-circuits schematic for explaining how area wastage and wire-length wastage may develop if function-development cascades through the interconnect and diversified wire lengths are not provided.

Consider the example of FIG. 1B. A function of 3 input terms, f($T_1$, $T_2$, $T_3$), is to be output onto line resource 70 of an FPGA. (The function is shown as a logic AND of 3 terms for sake of simplicity. It could just as easily have been an OR of one term with the AND of two other terms or some other Boolean function. Also, the number of input terms could be much greater. This is merely a conceptual example.)

Interconnect line 70 is shown schematically as an equivalent circuit having inherent resistance $R_{IC}$, parasitic capacitance $C_{IC}$ and corresponding length, $L_{IC}$. Rather than mapping f($T_1$, $T_2$, $T_3$) as single function, the mapping tools have for some reason defined the function as $f_C(T_3, f_a(T_1, T_2))$. The function, $f_C(\ )$ is to be implemented by CLB 75 while the function, $f_a(\ )$ is to be implemented by CLB 71. Interconnect line 72, switchbox 73 and further interconnect line 74 provide the coupling from the output of first CLB 71 to the second CLB 75.

Using CLB 75 as an example, each CLB or each switchbox or each IOB is drawn in FIG. 1B as an equivalent circuit having a high-impedance input section 75.1 with a corresponding delay $D_C$ and a corresponding planar location $XY_C$. Location coordinates, $XY_a$, $XY_b$, $XY_C$, etc., are not resolved until final placement. In the interim, they may be viewed as variables. The corresponding CLB, IOB or switchbox may be viewed as a floating unit that is free to move across planar space until the state of final placement is achieved. Each interconnect line can be viewed as having varaible length and direction until final routing completes.

The output of CLB section 75.1 is represented as an idealized step-voltage source 75.2 that outputs a responsive signal transition at time $t_C$. Transition time $t_C$ may be later than the time of delay $D_C$ of front section 75.1 taken alone. For example, if the CLB output is registered so as to switch at a specified clock edge, time point $t_C$ may occur in synchronism with the clock edge rather than at the end of delay period $D_C$.

A series source resistance $R_{Sc}$ (75.3) of the idealized voltage source 75.2 combines with the $R_{IC}$ (70.3) and $C_{IC}$ of output line 70 to define the time when output signal f($T_1$, $T_2$, $T_3$) actually becomes valid at the far end of the output line.

Interconnect lines 72 and 74 have respective lengths $L_{Ia}$ and $L_{Ib}$. They further have corresponding line resistances and capacitances, $R_{Ia}$, $C_{Ia}$ and $R_{Ib}$, $C_{Ib}$. Their directions may be defined as well although this is not explicitly done.

In switchbox 73, the repowering amplifier 73.1 and output voltage source 73.2 are optional and may be instead replaced by a wire with a parasitic PIP capacitance. (See above Table-1 which characterizes a possible PIP capacitance.) The planar location $XY_b$ of switchbox 73 however, is not optional since the switchbox is typically located somewhere between CLB 71 and CLB 75. The combination of planar locations $XY_a$, $XY_b$, and $XY_c$, define the minimal values for line lengths $L_{Ia}$ and $L_{Ib}$, as well as the directions in which respective lines 72 and 74 extend.

Elements 81, 82 and 83 represent possible sources for respective input terms, $T_1$, $T_2$, and $T_3$. Each of elements 81, 82 and 83 may be a CLB or an IOB or a switchbox.

Lines 85 and 86 respectively couple source elements 81, and 82 to term inputs of CLB 71. Line 87 couples source element 83 to a term input of CLB 75. Each of elements 81, 82 and 83 has a respective XY location that is ultimately resolved at placement time. If line 86 is longer than necessary, then such excess length is represented as not__ used length, $L_{I2\_NU}$. This excess of course comes with the cost of additional capacitance due to the excess length.

If CLB 71 has more function resource than necessary to combine input terms $T_1$ and $T_2$, then the excess functional capability is represented by logic gate NU. This excess of course comes with the cost of additional circuit area (silicon area) being consumed by the not-used functional capability, NU.

It is seen from FIG. 1B that cascaded development of larger functions (e.g., f($T_1$, $T_2$, $T_3$)) by use of multiple CLB's (71, 75) and interlinking switchboxes (73) and interconnect lines (72, 74) can result in cascading-effectuated delays. There is also the possibility of wasted wire length, $L_{I2\_NU}$ and wasted chip area and wasted functional resources (NU).

Such cascading-effectuated delays may be minimized if cascaded structures can be identified and their respective functionalities can be compacted or nucleated into the coarser-grained logic function resources of the target FPGA device 60 (FIG. 1A). When this is done, more of the development of a given function is carried out within nucleated resources such as the VGB's or SVGB's of the targeted FPGA device and less of the function development relies on cascading through interconnect.

Step 45 of FIG. 1A represents such a function-density, nucleating, optimization process. In short, the mapping results of step 42 is repartitioned to minimize interconnect usage by changing cascaded functions into nucleated functions (to the extent allowed by the target FPGA). This helps to maximize usage of silicon area within each logic function implementing resource (CBB or VGB or SVGB) and minimize consumption of the scarce resources in the interconnect.

Figure 1C:
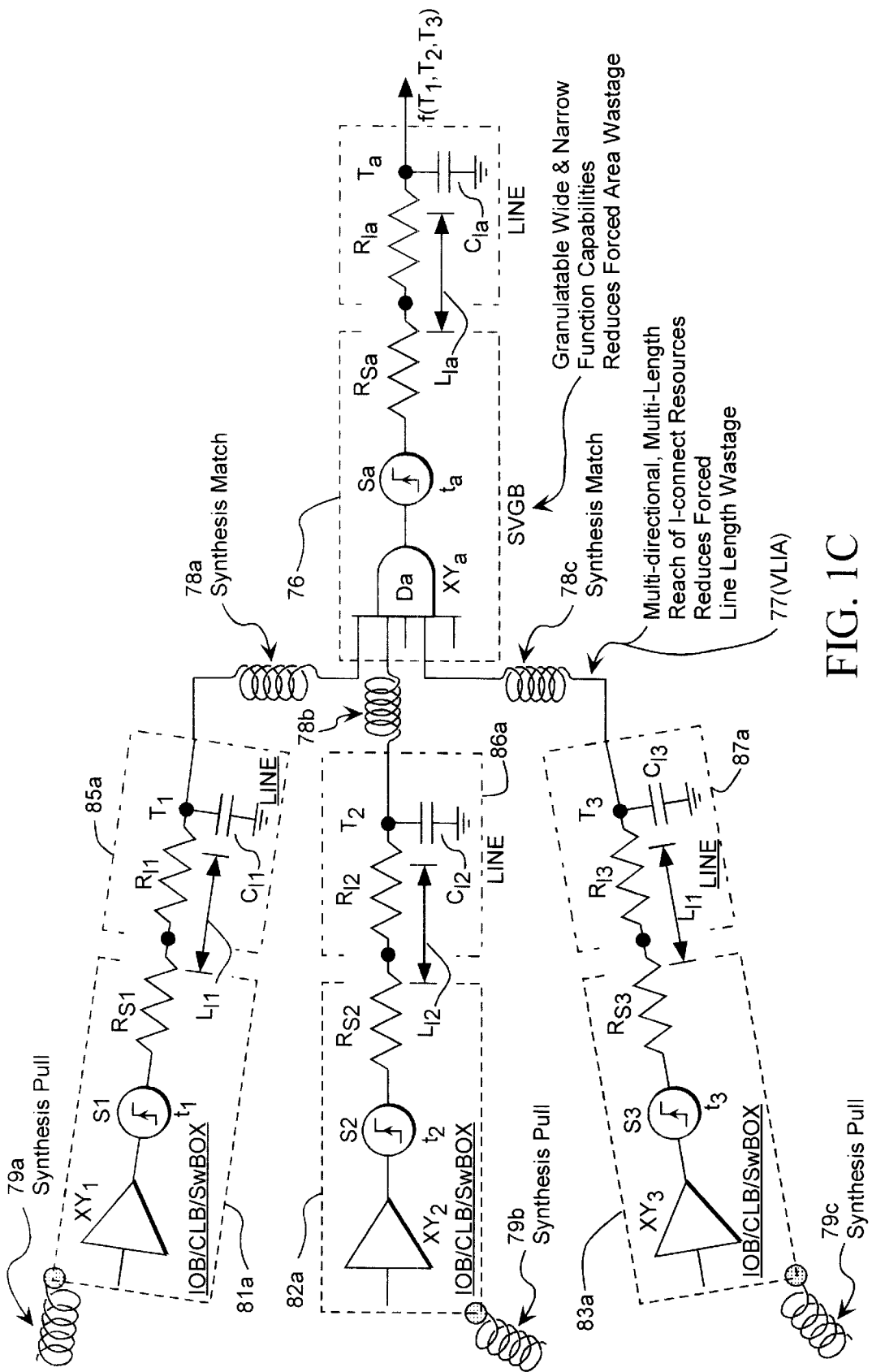
FIG. 1C is an equivalent-circuits schematic for explaining how area wastage and wire-length wastage may be avoided through the use of the complementary Variable Grain Architecture (VGA) and the Variable Length Interconnect Architecture (VLI) of the invention.

FIG. 1C shows how this optimization step (45) provides a comparative improvement over FIG. 1B for developing the exemplary function, $f(T_{11} \; T_{21} \; T_3)$. SVGB 76 is a granulatable logic unit in accordance with the Variable Grain Architecture such that SVGB 76 offers mixes of wide and narrow function capabilities. The offered mixes of wide and narrow function capabilities help the software to reduce forced area wastage at step 45 (FIG. 1A) by nucleating (congregating) as much of the development of function, $f(T_1, T_2, T_3)$ into a wedged-together superstructure (76) rather than relying on cascading and more use of interconnect resources. This reduces cascading-effectuated delays and also frees the not-used interconnect resources (72, 73, 74 of FIG. 1B) for other tasks.

The Variable Length Interconnect Architecture (VLIA) of the present invention is represented at 77 in FIG. 1C. Such VLIA 77 provides symmetrical multi-directional options —by choice of multi-length interconnect resources—for reaching from each of the interim-wise, floating signal sources, 81*a*, 82*a*, 83*a* to the congregated-function superstructure 76 (wedged-together superstructure 76), so as to match the length and direction changes that the synthesis imposes on the ultimate XY coordinates of signal sources, 81*a*, 82*a*, and 83*a*, relative to superstructure 76. The multi-directional symmetry aspect of the Variable Length Interconnect Architecture (VLIA) helps to reduce the number of switchboxes needed for reaching from a first SVGB (or VGB or CBB) to a second SVGB (or VGB or CBB). The choices of different length wires (and timings) that the VLIA offers helps to reduce forced line length wastage, such that of wasted wire length, $L_{I2\_NU}$ in FIG. 1B.

The spring-like icons shown at 79*a*, 79*b* and 79*c* respectively represent the tensions that synthesis, mapping and other steps apply to the variable XY coordinates of each of signal sources, 81*a*, 82*a*, and 83*a*, relative to the $XY_a$ coordinates of superstructure 76 prior to the final setting of all placements and routings. The spring-like icons shown at 78*a*, 78*b* and 78*c* respectively represent the ability of the Variable Length Interconnect Architecture (VLI) to provide matching interconnect resources of different directions, lengths and/or timings in response to the pulls 79*a*, 79*b* and 79*c*, of synthesis, mapping and other steps that precede final placement and routing.

It is seen from the above that the Variable Grain Architecture (VGA) and the Variable Length Interconnect Architecture (VLI) complement each other to allow step 45 of FIG. 1A to perform its operations of maximizing function-development density in each SVGB (or VGB or CBB) without excessive wastage of function resources (silicon area) in subsequent placement steps. The diversity of the VLIA allows later routing to pick the minimum length wires of various directions so as to avoid excessive wastage of wire lengths in the subsequent routing steps.

In FIG. 1A, after the nucleating optimization step 45 is performed, the repartitioned constructs are placed within specific positions of the FPGA device as indicated by placement step 51. Note that each placed 'chunk' of design circuitry (where a 'chunk' is a partitioned section that is sized for placement into a CBB or into a pair of CBB's or into a triad of CBB's or into a VGB or into a pair of VGB's or into an SVGB) has been optimized to reduce silicon area wastage by virtue of nucleating step 45. In addition, placement step 51 seeks to fill every SVGB so there are no left-over function resources in SVGB's. Thus placement step 51 becomes a low wastage placement.

The interconnect resources of the FPGA device are then used for completing the circuits as indicated by routing step 52. Routing step 52 seeks to use the smallest number and smallest length of available wires possible while also minimizing the number of used switchboxes in accordance with the improvement of FIG. 1C over FIG. 1B. Thus, routing step 52 qualifies as a low-wastage routing step.

After placement 51 and routing 52 completes, a simulation test 53 is performed to determine how well the to-be-implemented FPGA design will perform. Typically, there will be low-level bottlenecks that slow down performance. Fine tuning process 55 is a further optimization step which attempts various changes in one or more of the initial routing 52 or placement 51 or repartitioning 45 in order to obtain better results in test step 53. The inner and/or outer loops of step 55 and subsequent repeats of one or more of steps 51, 52, and 153 may be repeated a number of times before a stopping point is reached for final implementation. The results are then used for defining the configuration data of the targeted FPGA device 60 as indicated by step 56. The targeted FPGA device is so configured and physically tested. In response to the actual results of physical testing and debugging, designers may next choose to make modifications at the higher synthesis level and repeat the process of FIG. 1A again, some times, multiple times in a given 8 hour period.

Figure 1D:
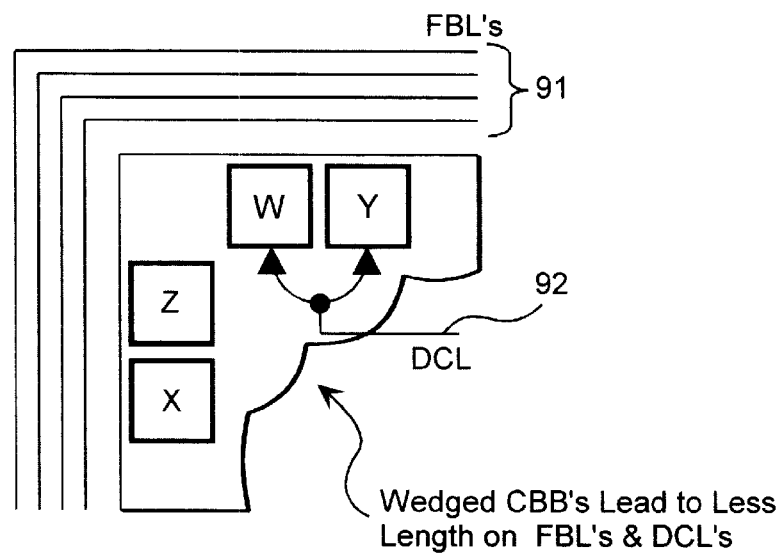
FIG. 1D shows how wedging-together of Configurable Building Blocks (CBB's) leads to shorter feedback lines (FBL's) and shorter direct connect lines (DCL's)
Figure 1E:
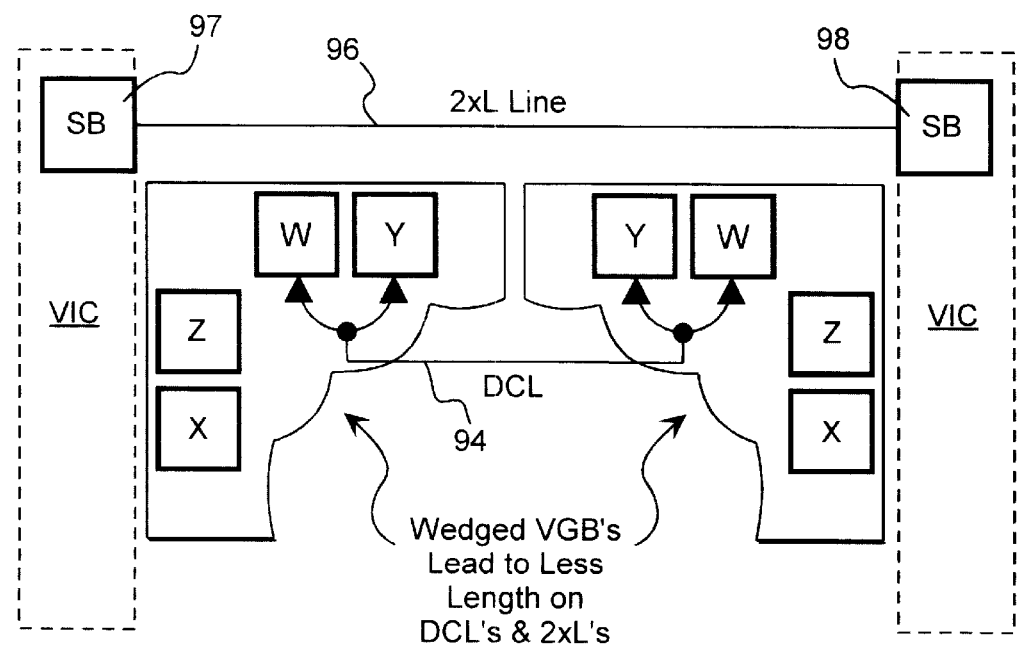
FIG. 1E shows how wedging-together of Variable Grain Blocks (VGB's) leads to shorter DCL's and shorter double-length lines (2xL lines)

A further synergistic cooperation between the Variable Grain Architecture (VGA) and the Variable Length Interconnect Architecture (VLI) is seen in FIGS. 1D and 1E. Configurable Building Blocks within each VGB, such as the X, Z, W, and Y blocks shown in FIG. 1D are wedged-together in an L-shaped arrangement without any intervening, interconnect channels. The lack of intervening interconnect channels allows for shorter feedback lines (FBL's) such as shown at 91. The lack of intervening interconnect channels also allows for shorter direct connect lines (DCL's) such as shown at 92.

Groups of four, mirror oriented, VGB's are wedged-together as indicated in FIG. 1E without any intervening, interconnect channels. The lack of intervening interconnect channels allows for shorter direct connect lines (DCL's) such as shown at 94. The lack of intervening interconnect channels also allows for shorter double-length lines (2xL lines) such as shown at 96. A first terminating switchbox is shown at 97 within the left-side vertical interconnect channel (VIC). A second terminating switchbox for the illustrated 2xL line is shown at 98 within the right-side VIC.

In each of the cases of FIGS. 1D and 1E, the lack of intervening interconnect channels allows for shorter wire lengths, and hence less capacitance, less resistance and shorter signal transmission times.

Figures 2, 2A:
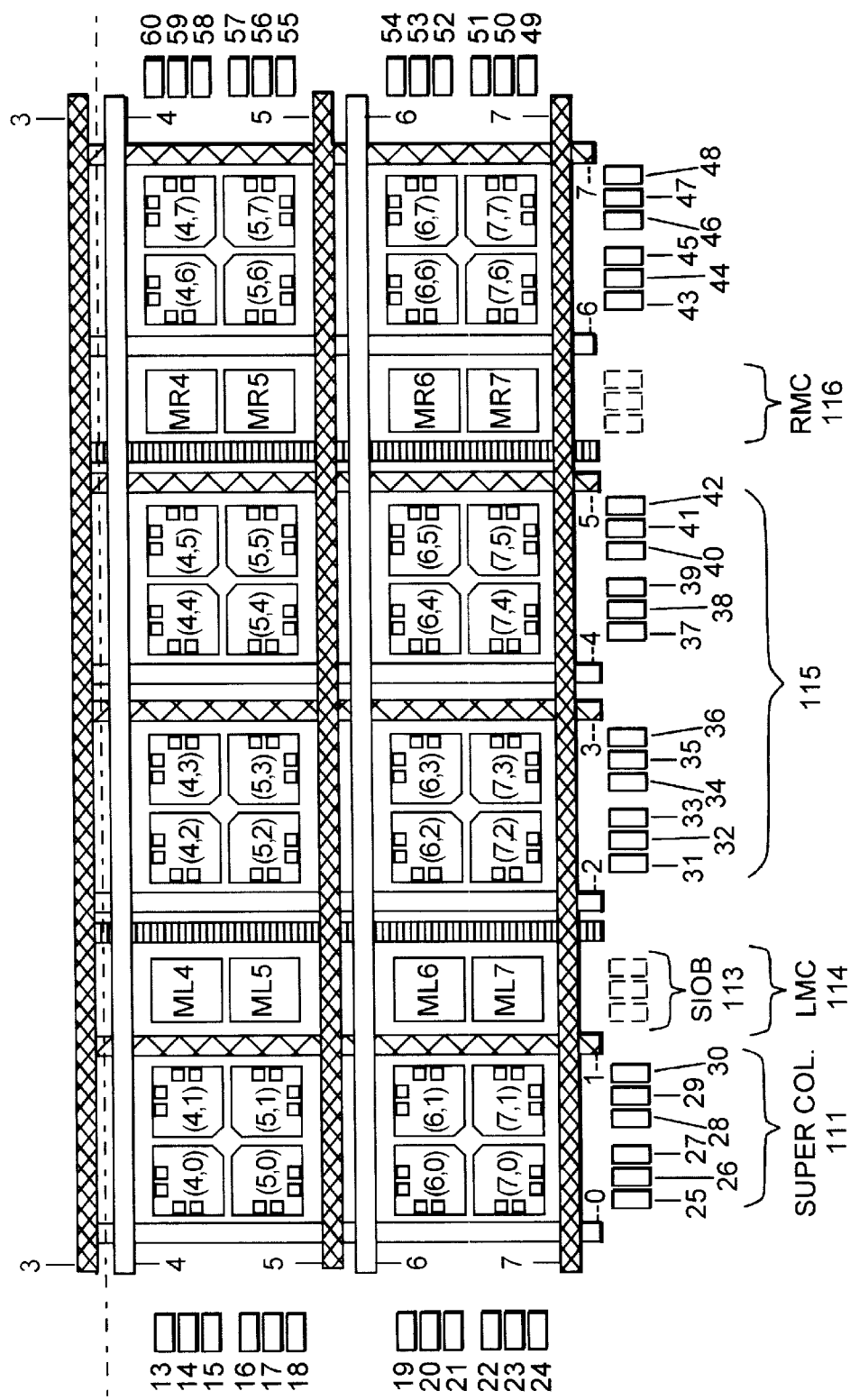
FIG. 2A illustrates a first FPGA having an 8×8 matrix of VGB's (Variable Grain Blocks) with an embedded left memory column (LMC) and an embedded right memory column (RMC)

FIG. 2A shows a macroscopic view of an FPGA device 100 in accordance with the invention. The illustrated structure is preferably formed as a monolithic integrated circuit.

The macroscopic view of FIG. 2A is to be understood as being taken at a magnification level that is lower than later-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity.

FPGA device 100 includes a regular matrix of super structures defined herein as super-VGB's (SVGB's). In the illustrated embodiment, a dashed box (upper left corner) circumscribes one such super-VGB structure which is referenced as 101. There are four super-VGB's shown in each super row of FIG. 2A and also four super-VGB's shown in each super column. Each super row or column contains plural rows or columns of VGB's. One super column is identified as an example by the braces at 111. Larger matrices with more super-VGB's per super column and/or super row are of course contemplated. FIG. 2A is merely an example.

There is a hierarchy of user-configurable resources within each super-VGB. At a next lower level, each super-VGB is seen to contain four VGB's. In the illustrated embodiment, identifier 102 points to one such VGB within SVGB 101.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 103 points to one such CBB within VGB 102.

At a next lower level, each CBB has its own hierarchy of user configurable resources. Some of these will be shown in later figures. A more detailed description of the hierarchal resources of the super-VGB's, VGB's, CBB's, and so forth, may be found in the above-cited Ser. No. 08/948,306 filed Oct. 9, 1997 by Om P. Agrawal et al. and originally entitled, "VARIABLE GRAIN ARCHITECTURE FOR FPGA INTEGRATED CIRCUITS", whose disclosure is incorporated herein by reference.

It is sufficient for the present to appreciate that each CBB is capable of producing and storing at least one bit of result data and/or of outputting the result data to adjacent interconnect lines. Each VGB (102) is in turn, therefore capable of producing and outputting at least 4 such result bits at a time to adjacent interconnect lines. This is referred to as nibble-wide processing. Nibble-wide processing may also be carried out by the four CBB's that line the side of each SVGB (e.g., 101).

With respect to the adjacent interconnect lines (AIL's), each SVGB is immediately bounded by two horizontal and two vertical interconnect channels (HIC's and VIC's). An example of a HIC is shown at 150. A sample VIC is shown at 160. Each such interconnect channel contains a diverse set of interconnect lines and switchbox areas (SBA's) at their intersections as will be explained.

The combination of each SVGB (e.g., 101) and its surrounding interconnect resources (of which resources, the SBA's and others are not all are shown in FIG. 2A) is referred to as a matrix tile. Matrix tiles are tiled one to the next as seen, with an exception occurring about the vertical sides of the two central, super columns, 115. Columns 114 (LMC) and 116 (RMC) of embedded memory are provided along the vertical sides of the central pair 115 of super columns. These columns 114, 116 are described in more detail in the above-cited Ser. No. 08/996,049 filed Dec. 22, 1997, by Om Agrawal et al. and originally entitled, "DUAL PORT SRAM MEMORY FOR RUN-TIME USE IN FPGA INTEGRATED CIRCUITS".

From a more generalized perspective, the tiling of the plural tiles creates pairs of adjacent interconnect channels within the core of the device 100. An example of a pair of adjacent interconnect channels is seen at HIC's 1 and 2. The peripheral channels (HIC0, HIC7, VIC0, VIC7) are not so paired. Switchbox areas (not shown, see FIG. 2A) are formed at the intersections of the respective vertical and horizontal interconnect channels. The four switchbox areas (designated as NW, NE, SE and SW) form part of each matrix tile construct that includes a super-VGB at its center. See FIG. 4.

The left memory column (LMC) 114 is embedded as shown to the left of central columns pair 115. The right memory column (RMC) 116 is further embedded as shown to the right of the central columns pair 115. It is contemplated to have alternate embodiments with greater numbers of such embedded memory columns symmetrically distributed in the FPGA device.

Within the illustrated LMC 114, a first, special, vertical interconnect channel (SVIC) 164 is provided adjacent to respective, left memory blocks ML0 through ML7. Within the illustrated RMC 164, a second, special, vertical interconnect channel (SVIC) 166 is provided adjacent to respective, right memory blocks MR0 through MR7.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 114 or RMC 116. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 is organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (102) and/or to the nibble-wise organization of each group of four CBB's that line the side of each SVGB (101). Thus, there is a data-width match between each embedded memory block and each group of four CBB's or VGB and adjoining interconnect buses of different lengths.

At the periphery of the FPGA device 100, there are three input/output blocks (IOB's) for each row of VGB's and for each column of VGB's. One such IOB is denoted at 140. The IOB's in the illustrated embodiment are shown numbered from 1 to 96. In one embodiment, there are no IOB's directly above and below the LMC 114 and the RMC 116. In an alternate embodiment, special IOB's such as shown in phantom at 113 are provided at the end of each memory column for driving address and control signals into the corresponding memory column.

Each trio of regular IOB's at the left side (1–24) and the right side (49–72) of the illustrated device 100 may be user-configured to couple to the nearest HIC. Similarly, each trio of regular IOB's on the bottom side (25–48) and top side (73–96) may be user-configured for exchanging input and/or output signals with lines inside the nearest corresponding VIC. The SIOB's (e.g., 113), if present, may be user-configured to exchange signals with the nearest SVIC (e.g., 164). Irrespective of whether the SIOB's (e.g., 113) are present, data may be input and/or output from points external of the device 100 to/from the embedded memory columns 114, 116 by way of the left side IOB's (1–24) and the right side IOB's (49–72) using longline coupling, as will be seen below. The longline coupling allows signals to move with essentially same speed and connectivity options from/to either of the left or right side IOB's (1–24, 49–72) respectively to/from either of the left or right side memory columns.

Data and/or address and/or control signals may also be generated within the FPGA device 100 by its internal VGB's and transmitted to the embedded memory 114, 116 by way of the HIC's.

The VGB's are numbered according to their column and row positions. Accordingly, VGB(0,0) is in the top left corner of the device 100; VGB(7,7) is in the bottom right corner of the device 100; and VGB(1,1) is in the bottom right corner of SVGB 101.

Each SVGB (101) may have centrally-shared resources. Such centrally-shared resources are represented in FIG. 2A by the diamond-shaped hollow at the center of each illustrated super-VGB (e.g., 101). Longline driving amplifiers correspond with these diamond-shaped hollows and have their respective outputs coupling vertically and horizontally to the adjacent HIC's and VIC's of their respective super-VGB's.

As indicated above, each super-VGB in FIG. 2A has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB as will be described below. Another of these processes is implementation of a 4:1 dynamic multiplexer within each CBB. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 114/116. Nibble-wide data may be transferred between one or more groups of four CBB's each to a corresponding one or more blocks of embedded memory (MLx or MRx) by way of sets of 4 equally-long lines in a nearby HIC. Each such set of 4 equally-long lines may be constituted by the double-length lines (2xL lines), quad-length lines (4xL lines), octal-length lines (8xL lines) or maximum length longlines (MaxL lines).

In one particular embodiment of the FPGA device, the basic matrix is 10-by-10 SVGB's, with embedded memory columns 114/116 positioned around the central two super columns 115. (See FIG. 2B.) In that particular embodiment, the integrated circuit is formed on a semiconductor die having an area of about 120,000 mils$^2$ or less. The integrated circuit includes at least four metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have drawn channel lengths of 0.35 microns or 0.25 microns or less. Amplifier output transistors and transistors used for interfacing the device to external signals may be larger, however.

Figure 2B:
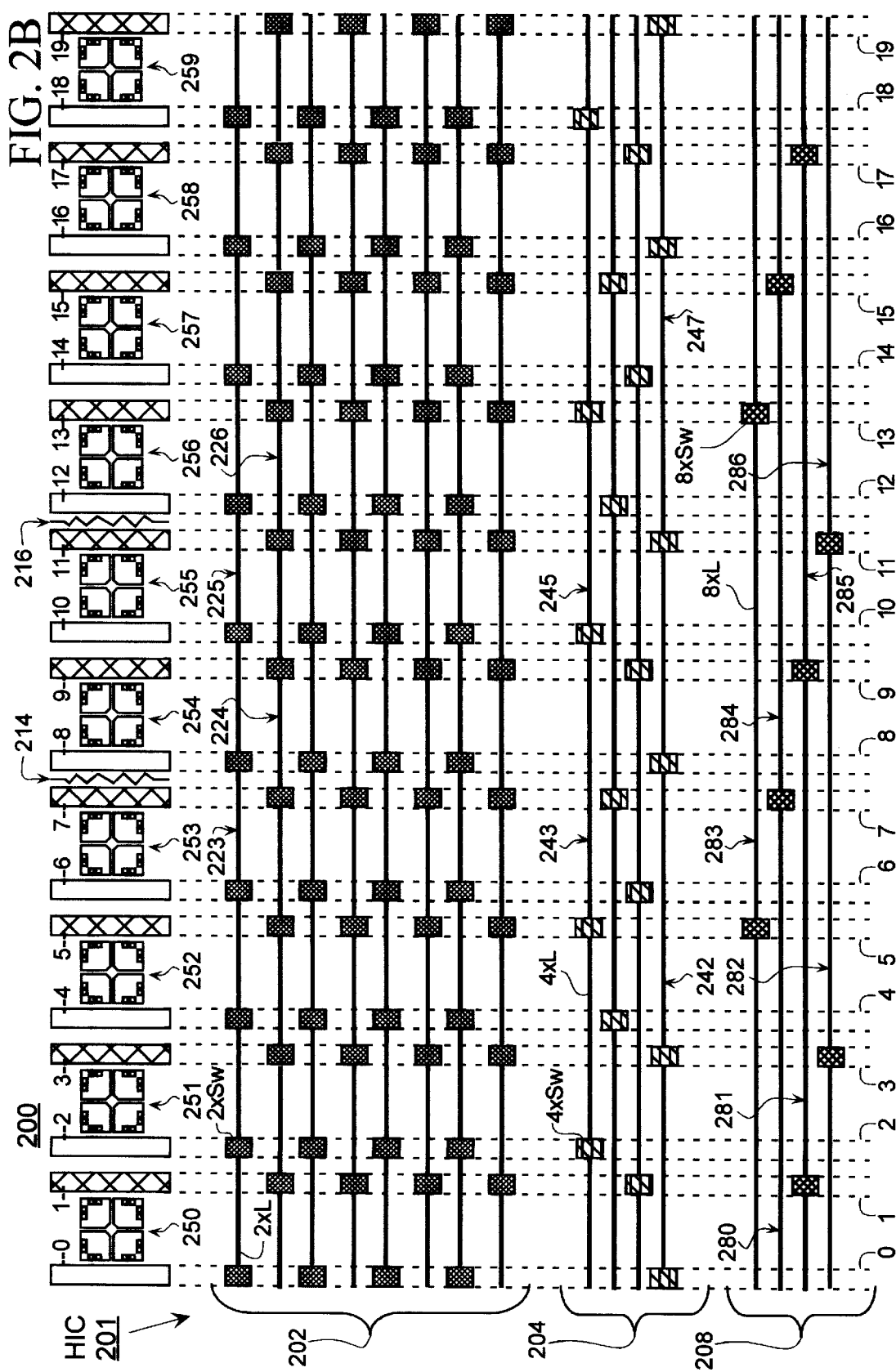
FIG. 2B is a diagram showing the placement of switch boxes along double length, quad length, and octal length lines within normal interconnect channels of another, like FPGA device having a 20×20 matrix of VGB's with embedded LMC and RMC.

As indicated above, the general interconnect channels (e.g., HIC 150, VIC 160 of FIG. 2A) contain a diverse set of interconnect lines. FIG. 2B shows a distribution 200 of different-length horizontal interconnect lines (2xL, 4xL, 8xL) and associated switch boxes of a single horizontal interconnect channel (HIC) 201, as aligned relative to vertical interconnect channels in an FPGA of the invention.

This particular FPGA has a 10×10 matrix of super-VGB's (or a 20×20 matrix of VGB's). The embedded memory columns (114/116) are not fully shown, but are understood to be respectively embedded in one embodiment, between VIC's 7–8 and 11–12, as indicated by zig-zag symbols 214 and 216.

Because the interconnect mesh of FPGA 100 includes lines having different lengths, it may be said that; without taking into account any length changes created by the imposition of the embedded memory columns 114/116, the horizontally-extending general interconnect channels (HIC's) and vertically-extending general interconnect channels (VIC's) of the FPGA device 100 are provided with essentially same and symmetrically balanced interconnect resources for their respective horizontal (x) and vertical (y) directions. These interconnect resources include a diversified and granulated assortment of MaxL lines, 2xL lines, 4xL lines and 8xL lines as well as corresponding 2xL switch boxes, 4xL switch boxes, and 8xL switch boxes.

Figure 5A:
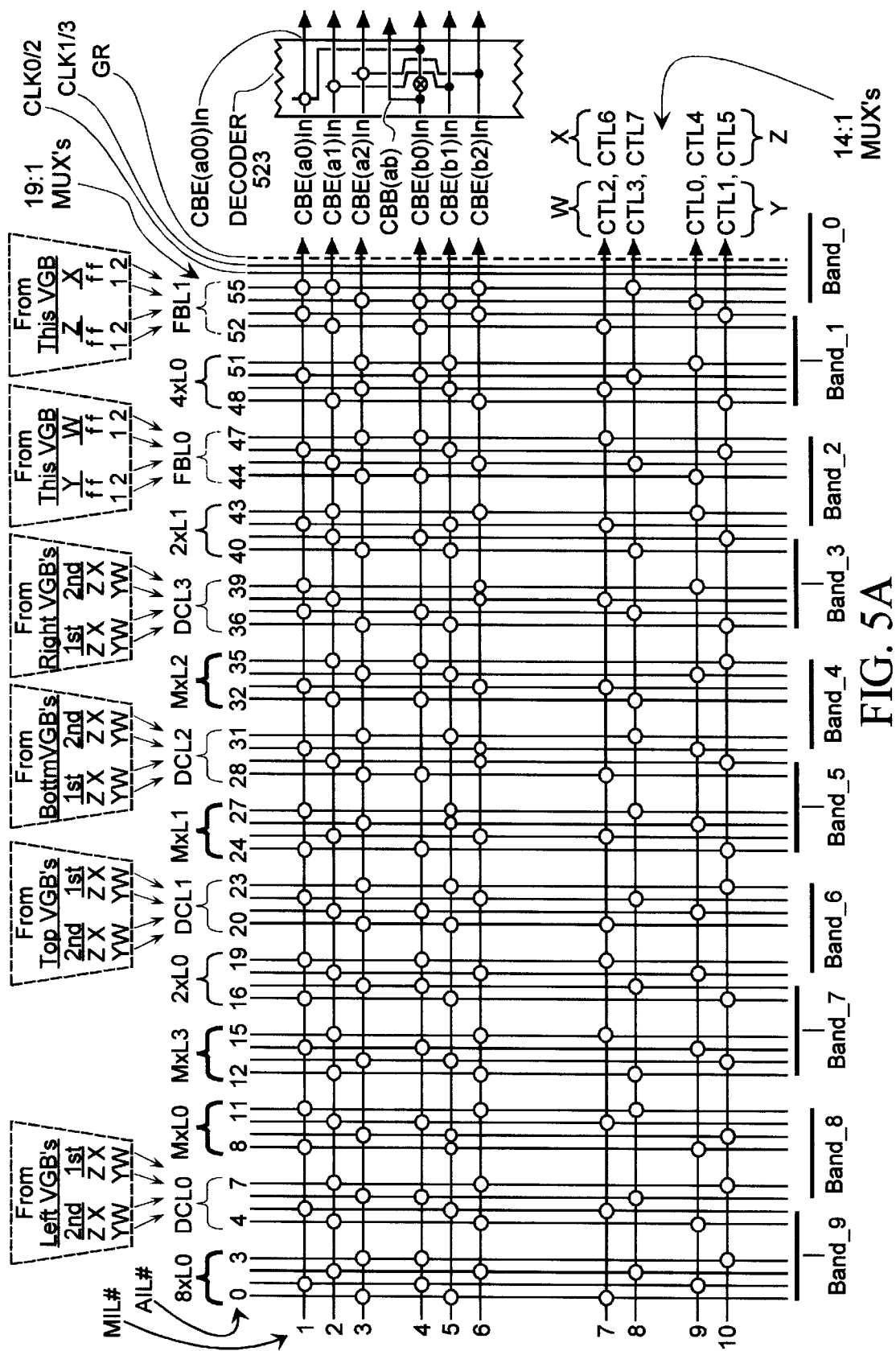
FIG. 5A shows the AIL line numbering system used herein and illustrates how the AIL's (adjacent interconnect lines) may be configurably coupled to input terminals (MIL's) of an adjacent Configurable Building Block (CBB)

In one embodiment, each general channel, such as the illustrated example in FIG. 2B of HIC 201 (the horizontal interconnect channel), contains the following resources: eight double-length (2xL) lines, four quad-length (4xL) lines, four octal-length (8xL) lines, sixteen full-length (MaxL) lines, sixteen direct-connect (DC) lines, eight feedback (FB) lines and two dedicated clock (CLK) lines. Vertical ones of the general interconnect channels (VIC's) contain an additional global reset (GR) longline. This total of 58/59 lines is seen in FIG. 5A. Not all of these lines are shown in FIG. 2B. Note that each of the 2xL, 4xL, 8xL and MaxL line sets includes at least four lines of its own kind for carrying a corresponding nibble's worth of data or address or control signals in the corresponding direction (horizontal x or vertical y).

In FIG. 2B, core channels 1 through 18 are laid out as adjacent pairs of odd and even channels. Peripheral channels 0 and 19 run alone along side the IOB's (see FIG. 2A). Although not shown in FIG. 2B, it should be understood that each switch box has both horizontally-directed and vertically-directed ones of the respective 2xL, 4xL, and 8xL lines entering into that respective switch box.(See FIGS. 5B–5E.) A given switchbox (XxSw) may be user-configured to continue a signal along to a next XxL line (e.g., 2xL line) of a same direction and/or to couple the signal to a corresponding same kind of XxL line of an orthogonal direction.

Group 202 represents the 2xL lines of HIC 201 and their corresponding switch boxes. For all of the 2xL lines, each such line spans the distance of essentially two adjacent VGB's (or one super-VGB). Most 2xL lines terminate at both ends into corresponding 2x switch boxes (2xSw's). The terminating 2xSw boxes are either both in even-numbered channels or both in odd-numbered channels. Exceptions occur at the periphery where either an odd or even-numbered channel is nonexistent. As seen in the illustrated embodiment 200, interconnections can be made via switch boxes from the 2xL lines of HIC 201 to any of the odd and even-numbered vertical interconnect channels (VIC's) 0–19.

With respect to the illustrated placement 214/216 of embedded memory columns 114/116, note in particular that 2xL line 223 and/or its like (other, similarly oriented 2xL lines) may be used to provide a short-haul, configurable connection from SVGB 253 (the one positioned to the right of VIC #6) to LMC 214 and to VIC's #6 and #8. Similarly, line 224 and its like may be used to provide a short-haul connection from SVGB 254 (the one positioned to the right of VIC #8) to LMC 214 and to VIC's #7 and #9. Line 225 and/or its like may be used to provide a short-haul connection from SVGB 255 to RMC 216 and to VIC's #10 and #12. Line 226 and/or its like may be used to provide a short-haul connection from SVGB 256 to RMC 216 and to VIC's #11 and #13. Such short-haul connections may be useful for quickly transmitting speed-critical signals such as address signals and/or data signals between a nearby SVGB (253–256) and the corresponding embedded memory column 114 or 116.

Group 204 represents the 4xL lines of HIC 201 and their corresponding switch boxes. Most 4xL lines each span the distance of essentially four, linearly-adjacent VGB's and terminate at both ends into corresponding 4x switch boxes (4xSw's). The terminating 4xSw boxes are one each in an even-numbered channel and an odd-numbered channel. As seen in the illustrated embodiment 200, interconnections can be made via switch boxes from the 4xL lines of HIC 201 to any of the odd and even-numbered vertical interconnect channels (VIC's) 0–19.

With respect to the illustrated placement 214/216 of embedded memory columns 114/116, note in particular that 4xL line 242 and/or its like (other, similarly oriented 4xL lines that can provide generally similar coupling) may be used to provide a medium-haul configurable connection between LMC 214 and either one or both of SVGB 252 and SVGB 253 as well as VIC's #3 and #8. Line 243 and/or its like may be used to provide a configurable connection of medium-length between LMC 214 and either one or both of SVGB's 253 and 254, as well as VIC's #5 and #10. Similarly, line 245 and/or its like may be used to provide medium-length coupling between RMC 216 and either one or both of SVGB's 255 and 256 as well as VIC's #10 and #13. Moreover, line 247 and/or its like may be used to configurably provide medium-haul interconnection between RMC 216 and either one or both of SVGB's 257 and 256 as well as VIC's #11 and #16. Such medium-haul interconnections may be useful for quickly propagating address signals and/or data signals in medium-speed applications.

Group 208 represents the 8xL lines of HIC 201 and their corresponding switch boxes. Most 8xL lines (7 out of 12) each spans the distance of essentially eight, linearly-successive VGB's. A fair number of other 8xL lines (5 out of 12) each spans distances less than that of eight, linearly-successive VGB's. Each 8xL line terminates at least one end into a corresponding 8x switch box (8xSw). The terminating 8xSw boxes are available in this embodiment only in the core odd-numbered channels (1, 3, 5, 7, 9, 11, 13, 15 and 17). Thus, in embodiment 200, interconnections can be made via switch boxes from the 8xL lines of HIC 201 to any of the nonperipheral, odd-numbered vertical interconnect channels (VIC's).

With respect to the illustrated placement 214/216 of embedded memory columns 114/116, note in particular that 8xL line 281 or its like may be used to provide even longer-haul, configurable connection from between LMC 214 and any one or more of SVGB's 251–254, as well as VIC's #1 and #9. In the illustrated embodiment, 8xL line 282 may be used to provide 8xL coupling between any two or more of: LMC 214 and SVGB's 252–255, as well as VIC's #3 and #11. Line 283 may be used to provide 8xL coupling between any two or more of: LMC 214, RMC 216, and SVGB's 253–256, as well as VIC's #5 and #13. Line 284 may be used to provide 8xL coupling between any two or more of: LMC 214, RMC 216, and SVGB's 254–257, as well as VIC's #7 and #15. Line 285 may be used to provide 8xL coupling between any two or more of: RMC 216 and SVGB's 255–258, as well as VIC's #9 and #17. Line 286 may be similarly used to provide 8xL coupling between any two or more of: RMC 216 and SVGB's 256–259, as well as VIC #11.

Figure 3A:
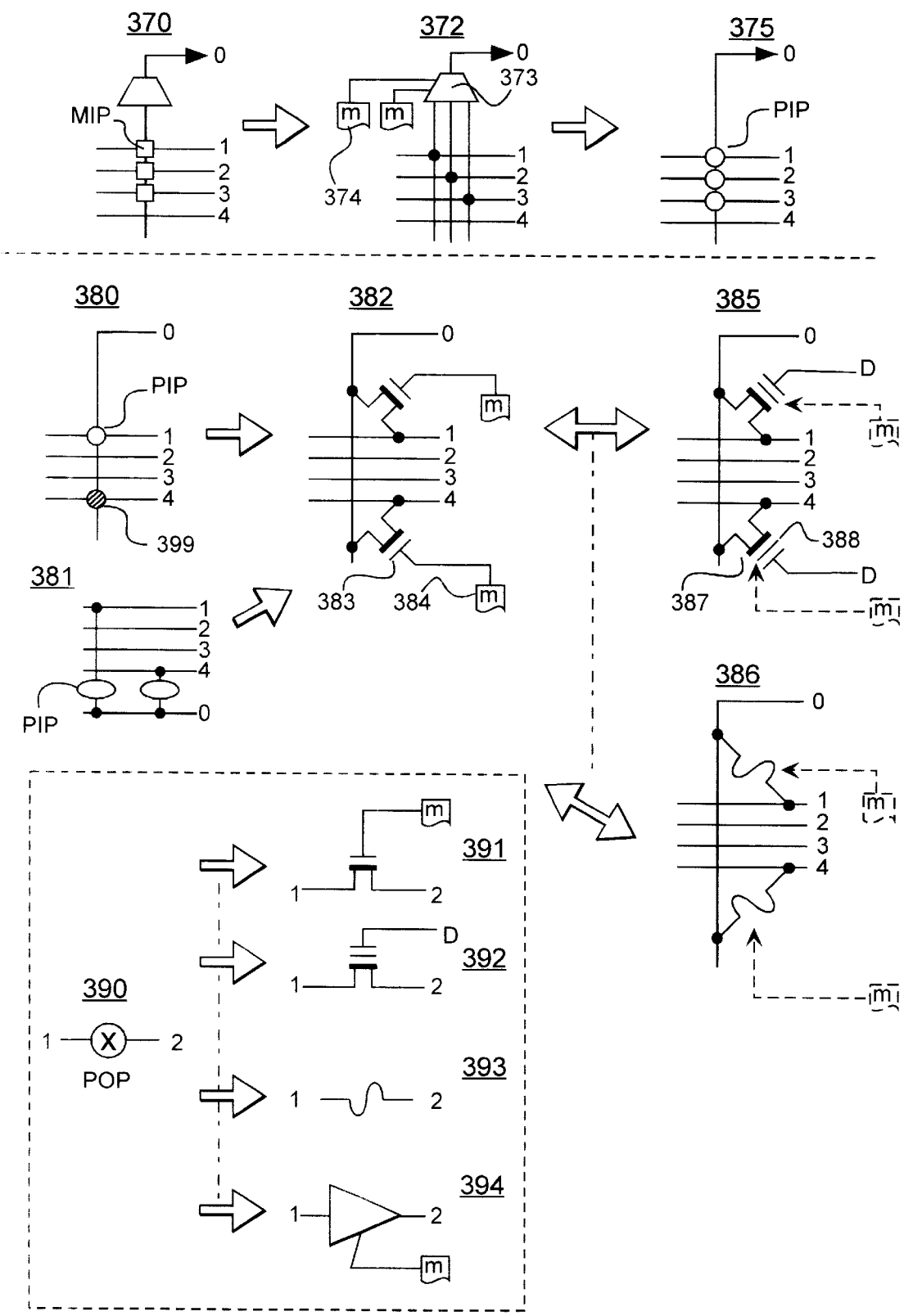
FIG. 3A provides a legend for symbols used within others of the drawings.

Before exploring more details of the architecture of FPGA device 100, it will be useful to define a legend for various symbols that may be used within the drawings. Such a legend is set forth in FIG. 3A. Unless otherwise stated, a single line going into a multiplexer symbol such as shown at 370 of FIG. 3A represents an input bus of one or more wires. Each open square box such as the MIP shown at 370 represents a point for user-configurable acquisition of a signal from the crossing line (e.g., 1, 2, 3). One implementation is shown at 372. Multiplexer 373 is controlled by configuration memory bits 374. The number of configuration memory bits 374 can vary depending on the number of MIP's (multiplexer input points) and whether selection decoding is carried out or not. One embodiment that has no selection decoding is shown at 375. Here, a PIP (programmable interconnect point) is placed at each MIP occupied intersection of output line 0 with crossing lines 1–4. Each of these PIP's is understood to have a single configuration memory bit controlling its state. In the active state the PIP creates a connection between the crossing lines. In the inactive state the PIP leaves an open between the illustrated crossing lines. Each of the crossing lines remains continuous however in its respective direction (x or y).

PIP's (each of which is represented by a hollow circle covering a crossing of two continuous lines) may be implemented in a variety of manners as is well known in the art. Two PIP's are shown at 380 for programmably creating a coupling between line 0 and respective ones of lines 1 and 4. In one embodiment shown at 382, pass transistors such as MOSFET 383 have their source and drain coupled to the crossing lines while the transistor gate is controlled by a configuration memory bit such as 384. In an alternate embodiment shown at 385, nonvolatilely-programmable floating gate transistors such as 387 have their source and drain coupled to the crossing lines. The charge on the floating gate 388 represents the configuration memory bit. A dynamic signal D or a static turn-on voltage may be applied to the control gate as desired. In yet another alternate embodiment shown at 386, nonvolatilely-programmable fuses or anti-fuses have their ends connected to the crossing lines. Each of examples 382, 385 and 386 demonstrates a bidirectional PIP for which signal flow between the crossing lines (e.g., 0 and 1) can move in either direction. Where desirable, PIP's can also be implemented with unidirectional signal coupling means such as AND gates, tri-state drivers (see 394), and so forth.

An alternate symbol for a PIP is constituted by a hollow ellipse covering a strapping connection between two parallel lines such as shown at 381. The schematic of 381 is an alternate way of representing the circuit of 380.

Another symbol used herein is the POP such as shown at 390. POP stands for 'Programmable Opening Point' and it is represented by a hollow circle with an 'X' inside. Unless otherwise stated, each POP is understood to have a single configuration memory bit controlling its state. In the active state the POP creates an opening between the collinear lines (1,2) entering it. In the inactive state the POP leaves closed an implied connection between the collinear lines (1,2) entering it. Possible implementations of POP's are shown at 391 through 394. In EEPROM implementation 392, the control gate signal D will be typically tied to the channel-inducing state so that the charge on the floating gate controls the POP state exclusively. The tri-state driver implementation of 394 is unidirectional of course. One embodiment of

394 comprises a CMOS output stage driven front-end decoder logic that inverts the input signal prior to presenting it to the end-stage CMOS inverter. The front-end decoder logic drives each of the P- and N-channel devices of the end-stage inverter into a non-conductive mode when a high-impedance open state is dictated by the corresponding configuration memory bit. Many other alternatives will be apparent to those skilled in the art.

Figure 3B:
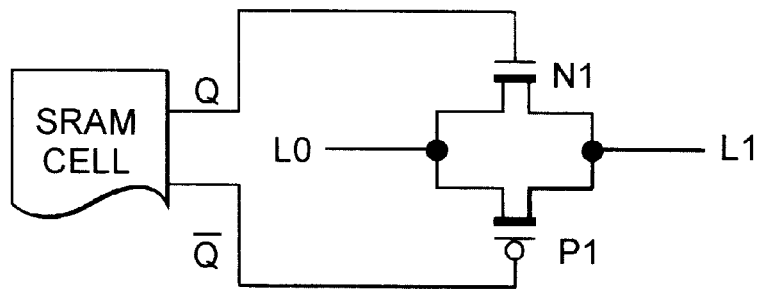
FIG. 3B is a schematic of a first transmission gate implementation of a PIP.

FIG. 3B shows yet another implementation of a bidirectional PIP at 395. Lines L0 and L1 are the programmably interconnectable entities. In this particular case, the controlling memory is an SRAM cell (Static Random Access Memory) having complementary Q and Q-bar outputs. The Q output drives the gate of an N-channel MOSFET, N_1 of the PIP. The Q-bar output drives the gate of an P-channel MOSFET, P_1 of the PIP. In general, transistor P_1 should be made with a larger channel width than that of transistor N_1 to compensate for the lower mobility of carriers in the P-channel of the P_1 device.

Figure 3C:
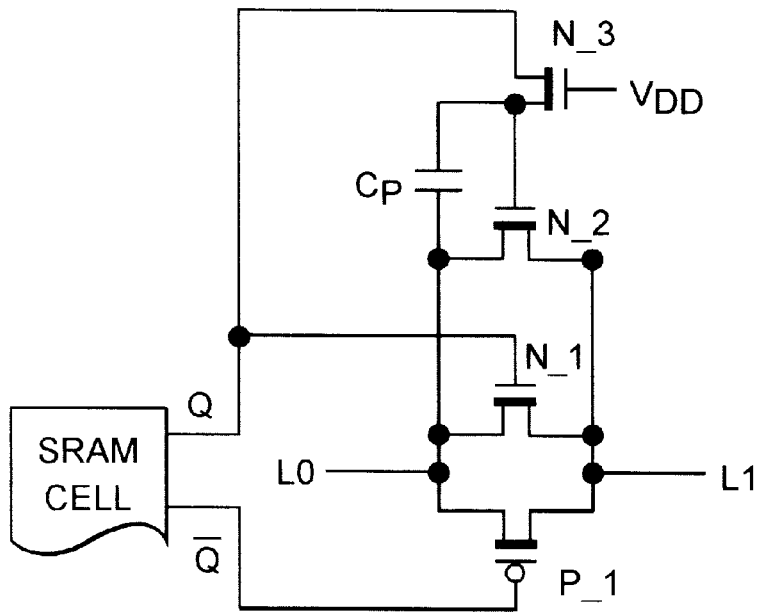
FIG. 3C is a schematic of a second transmission gate implementation of a PIP.

FIG. 3C shows yet another implementation of a bidirectional PIP at 398. Like reference symbols are used where appropriate for elements having like counterparts in FIG. 3B. The PIP shown at 398 may be referred to as a bootstrapped transmission gate. It is useful for binary operation in a low Vcc range such as 3.3 V or 2.5V. The parasitic gate-to-source capacitance CP of additional N-transistor N_2 may be used improve the conductivity of the PIP between L0 and L1 when Q is high (and Q-bar is at a lower voltage) and a low-to-high transition appears at L0 for transmission onto L1. Capacitance $C_P$ couples the low-to-high transition to the gate of N_2. N_3 had pre-established a slightly below threshold voltage on the gate of N_2 by virtue of N_3 having its drain coupled to the high Q, the source of N_3 being connected to the gate of N_2, and the gate of N_3 being coupled to VDD, the high voltage rail of the device. The capacitively coupled low-to-high transition boosts the voltage of N_2's gate above threshold and turns N_2 on. This assists the normally slower P_1 device with passing the low-to-high transition from L0 to L1. As such P_1 can be made with a channel width that is comparatively smaller than the width used for the PMOS device in the PIP 395 of FIG. 3B. In one embodiment, the channels of NMOS transistors N_1 and N_2 are 7 microns wide, the channel of PMOS transistor P_1 is 2 microns wide, and the channel of NMOS transistor N_3 is 2 microns wide.

Figure 4A:
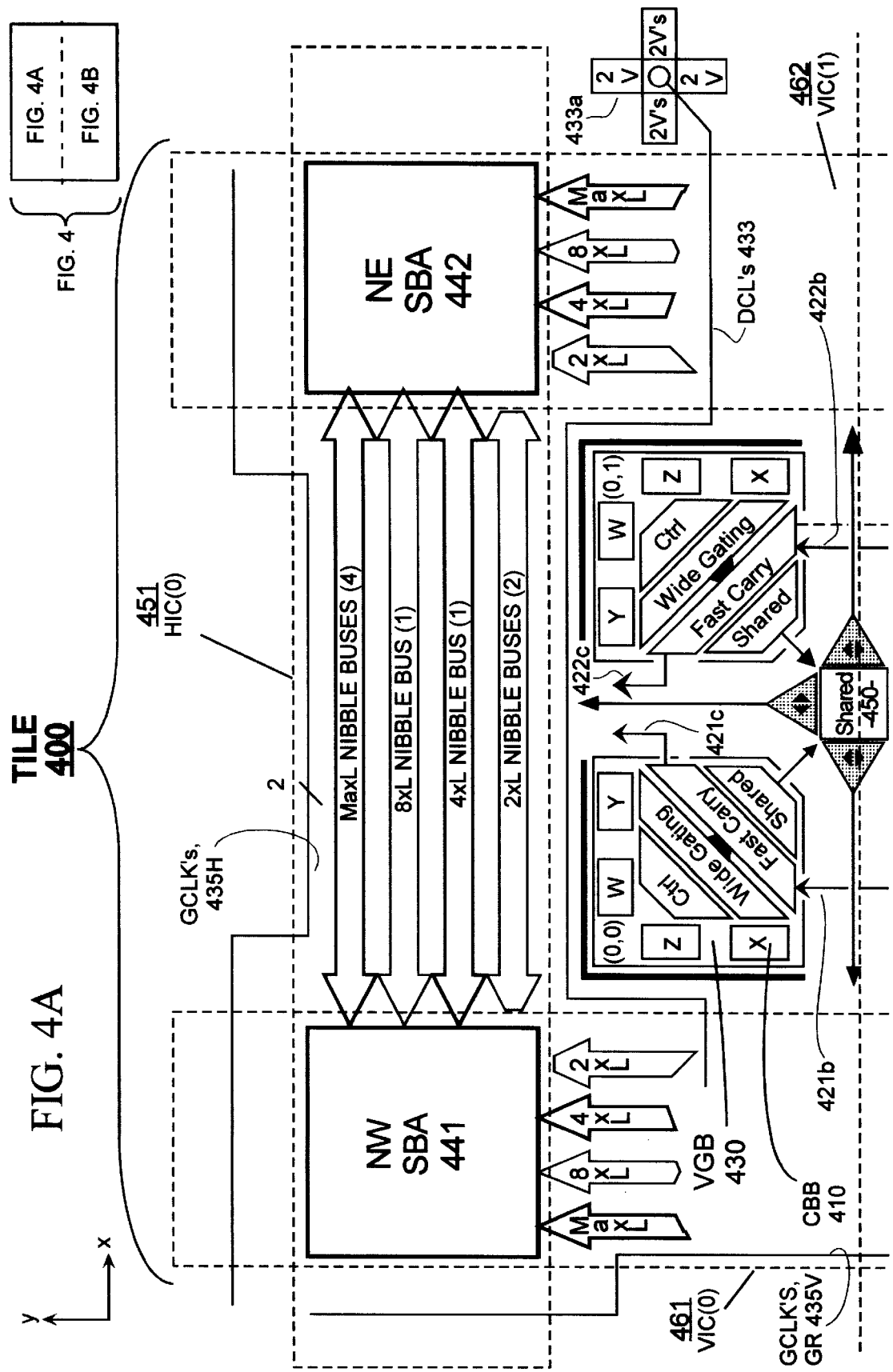
FIG. 4 illustrates details of an SVGB tile having a central Super-VGB (SVGB) and surrounding Horizontal Interconnect Channels (HIC's) and Vertical Interconnect Channels (VIC's) and respective NW, NE, SE, and SW switchbox areas.
Figure 4B:
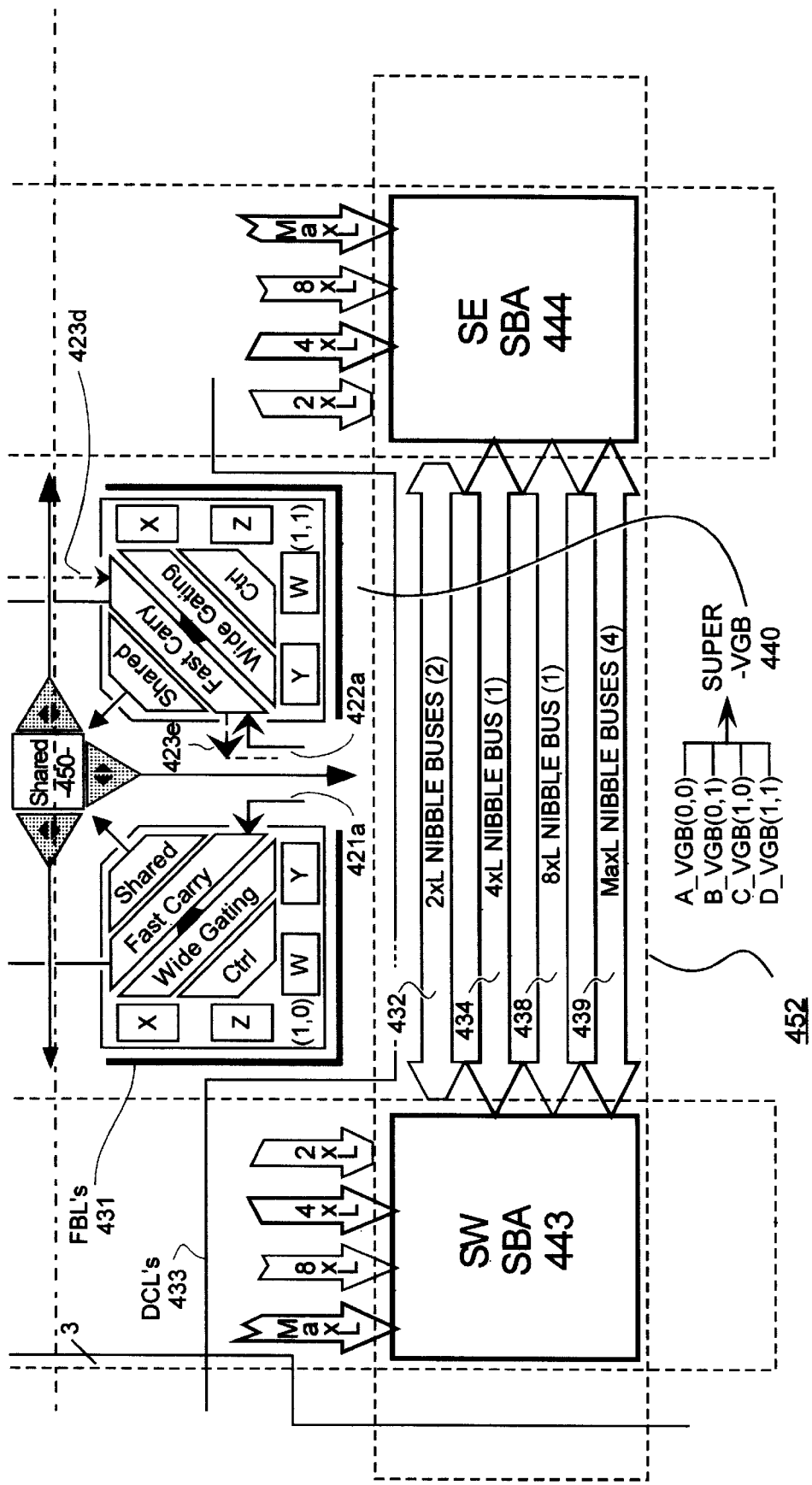

Referring now to FIG. 4, this figure provides a mid-scopic view of some components within an exemplary matrix tile 400. Of course, other implementations are possible for the more macroscopic view of FIG. 2A.

The mid-scopic view of FIG. 4 shows four VGB's brought tightly together in mirror opposition to one another. The four, so-wedged together VGB's are respectively designated as (0,0), (0,1), (1,0) and (1,1). The four VGB's are also respectively and alternatively designated herein as VGB_A, VGB_B, VGB_C, and VGB_D.

Reference number 430 points to VGB_A which is located at relative VGB row and VGB column position (0,0). Some VGB internal structures such as CBB's Y, W, Z, and X are visible in the mid-scopic view of FIG. 4. An example of a Configurable Building Block is indicated by 410 (CBB X). As seen, the CBB's 410 of each VGB 430 are arranged in an L-shaped organization and placed near adjacent interconnect and intraconnect lines.

These adjacent interconnect lines (AIL's) include: (a) VGB intraconnect lines, which are also referred to as feedback lines (FBL's 431); (b) VGB-to-VGB dedicated interconnect lines, which are also referred to as direct connect lines (DCL's 433); (c) double-length buses 432; (d) quad-length buses 434; (e) octal-length buses 438; (f) maximum-length buses 439; and (g) global clock/reset lines 435.

Each of buses groups, 432, 434, 438, 439 includes one or more nibble buses. A nibble-bus is 4-lines wide and thereby matches the 4-bits wide data processing and storing capabilities of each VGB or linear group of 4 CBB's. It is within the contemplation of the invention to substitute byte-buses (8-lines wide) for the nibble-buses if the data processing and storing capabilities of each VGB is increased to 8 bits.

Each double-length buses group 432 that is adjacent to a side of a respective VGB 430 comprises 2 nibble-buses as indicated parenthetically in FIG. 4. Each quad-length buses group 434 that is adjacent to a side of a respective VGB comprises 1 nibble-bus. Each octal-length buses group 438 that is adjacent to a side of a respective VGB comprises 1 nibble-bus. Each maximum-length buses 439 that is adjacent to a side of a respective VGB comprises 4 nibble-buses. The L-shaped feedback lines group 431 about each respective VGB 430 comprises 8 L-shaped feedback lines (2 for each CBB within the VGB). Each CBB drives a respective DCL 433. Each DCL extends in a cross-hair pattern as shown at 433a. The DCL-driving CBB is at the center of the crosshair pattern 433a while 8 driven VGB's are symmetrically distributed about the legs of the cross-hair pattern 433a. Thus there are 2 VGB's capable of receiving signals from the respective DCL in each leg of the cross-hair pattern 433a. Because there are 4 wedged-together VGB's in tile 400, each with 4 CBB's, tile 400 drives 16 independent DCL's (not shown), where the driven DCL's 433 extend symmetrically from tile 400.

Aside from the CBB's (X, Z, W, and Y), further VGB internal structures are seen in FIG. 4 such as each VGB's common controls developing (Ctrl) section, each VGB's wide-gating supporting section, each VGB's carry-chaining (Fast Carry) section, and each VGB's coupling to a shared circuit 450 of a corresponding super-structure (super-VGB) 440.

The eight local feedback lines (FBL's) 431 of each VGB 430 allow for high-speed transmission from one CBB to a next within a same VGB, of result signals produced by each CBB. The four direct connect lines (DCL's) 433 of each VGB 430 allow for high-speed transmission from one VGB (at center of cross-hair pattern 433a) to eight neighboring VGB's of result signals produced by each DCL-driving Configurable Building Block (CBB X, Z, W, and Y).

The mid-scopic view of FIG. 4 additionally shows tile 400 as including respective parts of four interconnect channels surrounding VGB's (0,0) through (1,1). The top and bottom, horizontally extending, interconnect channels (HIC's) are respectively identified as 451 and 452. The left and right, vertically extending, interconnect channels (VIC's) are respectively identified as 461 and 462. Each interconnect channel has a same number and mirror-symmetrical distribution of interconnect lines and switchboxes, with the exception of the global reset/set line (GR) which is found only in each of the VIC's but not in the HIC's.

Switchboxes are formed in mirror symmetrical switchbox areas (SBA), where the SBA's 441, 442, 443 and 444 are respectively formed in the NW, NE, SW and SE corners of the tile 400. These will be detailed in the discussion of FIGS. 5B–5E. SBA's 441, 442, 443 and 444 are organized in mirror image relationship to one another relative to corresponding vertical and horizontal centerlines (not shown) of tile 400.

As seen broadly in FIG. 4, the group of four VGB's, (0,0) through (1,1) are also organized in mirror image relationship to one another relative to corresponding vertical and horizontal centerlines (not shown) of the group and even to some extent relative to diagonals (not shown) of the same group. Vertical and horizontal interconnect channels (VIC's and HIC's) do not cut through this mirror-wise opposed congregation of VGB's. As such, the VGB's may be wedged-together tightly.

With respect to mirror symmetry among variable grain blocks, VGB (0,1) may be generally formed by flipping a copy of VGB (0,0) horizontally. VGB (1,1) may be similarly formed by flipping a copy of VGB (0,1) vertically. VGB (1,0) may be formed by flipping a copy of VGB (1,1) horizontally, or alternatively, by flipping a copy of VGB (0,0) vertically. The mirror-wise symmetrical packing-together of the four VGB's (0,0 through 1,1) is referred to herein as a 'Super Variable Grain Block' or a super-VGB 440.

In a preferred embodiment, the mirror symmetry about the diagonals of the super-VGB is not perfect. For example, there is a Fast Carry section in each VGB that allows VGB's to be chained together to form multi-nibble adders, subtractors or counters. (A nibble is a group of 4 data bits. A byte is two nibbles or 8 data bits. A counter generally stores and feeds back its result so as to provide cumulative addition or subtraction.) The propagation of rippled-through carry bits for these Fast Carry sections is not mirror wise symmetrical about the diagonals of each super-VGB 440. Instead it is generally unidirectional along columns of VGB's. Thus, CBB's X, Z, W, and Y are not interchangeable for all purposes.

The unidirectional propagation of carry bits is indicated for example by special direct connect lines 421*a*, 421*b* and 421*c* which propagate carry bits upwardly through the Fast Carry portions of VGBIs (0,0) and (1,0). The unidirectional propagation is further indicated by special direct connect lines 422*a*, 422*b* and 422*c* which propagate carry bits upwardly through the Fast Carry portions of VGBVs (0,1) and (1,1).

Such unidirectional ripple-through of carry bits may continue across the entire FPGA device so as to allow addition, subtraction or count up/down results to form in bit aligned fashion along respective columns of the FPGA device. Bit aligned results from a first set of one or more columns can be submitted to other columns (or even resubmitted to one or more columns of the first set) for further bit aligned processing. In one embodiment, the X CBB generally produces the relatively least significant bit (LSB) of result data within the corresponding VGB, the Z CBB generally produces the relatively next-more significant bit, the W CBB generally produces the relatively next-more significant bit, and the Y CBB generally produces the relatively most significant bit (MSB) of result data within the corresponding VGB. The carry-in bit in the lowest CBB of each column may be fixed such as by grounding or may be made configurable such by setting it with a corresponding configuration memory cell (not shown).

In an alternate embodiment, propagation of rippled-through carry bits may be zig-zagged first up and then down through successive columns of VGB's. In such an alternate zig-zagged design, the significance of bits for adder/subtractor circuits would depend on whether the bits are being produced in an odd or even column of VGB's.

The local feedback lines 431 of each VGB may be used to feedback its registered adder outputs to one of the adder inputs and thereby define a counter. The counter outputs can be coupled by way of the adjacent HIC to a next column of VGB's.

FIGS. 5–7E are provided to facilitate the understanding of the coupling that is provided by way of the HIC's and VIC's between corresponding inputs and outputs of the super-VGB's (440). It is helpful to study the I/O structure of selected components within each super-VGB to some extent so that the data-width matching and diversified-reach aspects of the interconnect can be appreciated. At the same time, it is to be understood that the description given here for internal elements of the SVGB's is less extensive than that given in the above-cited Ser. No. 08/948,306.

Each of the X, Z, W, and Y Configurable Building Blocks has six 19:1, input-terms acquiring multiplexers for acquiring a corresponding six input term signals of the CBB. The CBB can process the acquired signals in accordance with user-configuration instructions to produce result signals.

Each of the X, Z, W, and Y CBB's further has a result-signal storing register (not shown) and a 2/4/8xL drive amplifier for configurably outputting either a register-stored version of a CBB result signal or a nonstored (unregistered) result signal of the CBB onto adjacent ones of the 2xL lines, 4xL lines and 8xL lines. Control signals may be used by the CBB for controlling its internal, result-signal storing register (not shown). These control signals are acquired by way of respective, controls input multiplexers (14:1 Ctrl) of the respective CBB's X,Z,W,Y. There are two such controls input multiplexers (14:1 Ctrl) provided for each CBB.

In addition to its 2/4/8xL drive amplifier (not shown) each of the X, Z, W, and Y CBB's further has a dedicated direct-connect (DC) drive amplifier (not shown) for configurably outputting either a register-stored version of a CBB result signal or an nonstored (unregistered) result signal of the CBB onto adjacent ones of so-called, direct connect lines. Moreover, each CBB has means for outputting its registered or unregistered result-signals onto feedback lines (FBL's) of the VGB.

FIG. 5A illustrates a partial-populating scheme for the input-term and control-signal acquiring multiplexers of the respective X, Z, W, and Y CBB's of one embodiment in accordance with the invention. The adjacent interconnect lines (AIL's) are respectively numbered as #0 through #55. There are two dedicated clock (CLK) lines in each interconnect channel and one additional, global reset (GR) line in each VIC that are not included in this count. In one embodiment, AIL's 0–55 represent interconnect lines in the most immediately adjacent channel for each of CBB's X, Z, W, and Y.

In an alternate embodiment, AIL's 0–55 represent interconnect lines in the most immediately adjacent channel for each of CBB's X and Y while for the other CBB's, Z and W, the AIL's 0–55 of FIG. 5A represent the interconnect lines of the next adjacent channel. The exception is at the periphery of the matrix (see FIG. 2A) where there is no next adjacent channel, in which case AIL's 0–55 represent interconnect lines in the most immediately adjacent channel also for CBB's Z and W. This alternate configuration allows each VGB to acquire input term signals and control signals from both the even-numbered and odd-numbered interconnect channels that surround it. It is of course within the contemplation of the invention to have other configurations, such as for example wherein the CBB's that reach the most immediately adjacent channel are X and W rather than X and Y; and such as wherein the CBB's that reach the next adjacent channel are X and Y rather than Z and W.

Multiplexer input lines (MIL's) are numbered in FIG. 5A as 1 through 10. MIL's 1–3 correspond to the three 19:1 input term acquiring multiplexers of a first LUT (e.g., 'a') in each of the X, Z, W, Y CBB's. MIL's 4–6 correspond to the three 19:1 input term acquiring multiplexers of a second LUT (e.g., 'b') in each of the X, Z, W, Y CBB's. MIL's 7–8 correspond to the two 14:1 control signal acquiring multiplexers of each of the W and X CBB's. MIL's 9–10 correspond to the two 14:1 control signal acquiring multiplexers of each of the Y and Z CBB's. The illustrated partially-populated distribution of PIP's over the intersections of AILS's 0–55 and MIL's 1–10 should be self-explanatory in view of the legend shown in FIG. 3A. They provide respective means for acquiring input logic bits (be they input term or control bits) into the corresponding CBB.

AIL's 0–3 represent the four 8xL lines (the octal-length nibble bus) in each general interconnect channel (VIC or HIC). AIL's 4–7 represent a first group (DCL0) of four of the 16 direct connect lines in each such interconnect channel. The remaining DCL's are represented by the 20–23 (DCL1), 28–31 (DCL2) and 36–39 (DCL3) sets of AIL's. AIL's 8–11 represent a first group (MxL0) of four of the 16 MaxL lines in each general interconnect channel. The remaining MxL's are represented by the 24–27 (MxL1), 32–35 (MxL2) and 12–15 (MxL3) sets of AIL's.

AIL's 16–19 represent a first group (2xL0) of four of the 8 2xL lines (a first double-length nibble bus) in each interconnect channel. The other four 2xL lines are represented by the 40–43 (2xL1) group. AIL's 44–47 represent a first group (FBL0) of four of the 8 local feedback lines that may be considered as extending into each interconnect channel for purpose of intra-VGB communication. The other four feedback lines are represented by the 52–55 (FBL1) group. AIL's 48–51 represent the four 4xL lines (the quad-length nibble bus) in each interconnect channel.

The VIC's further include clock longlines CLK0 and CLK1 as well as global reset line GR. The HIC's further include CLK2 and CLK3 but not GR. The globally-distributed signals of CLK0–CLK3 may sourced from outside the chip or generated by on-chip PLL's (phase lock loops). The PLL phase may be offset to counter system clock skew. The shared control section of each VGB 430 acquires clock and reset signals from the adjacent control lines CLK0–CLK3 and GR and distributes derived control signals for the VGB from these.

Signal sources for the direct connect lines and the feedback lines are indicated respectively above corresponding AIL groups. In group DCL0 for example, AIL #7 is driven by either the X or the W DC driver of the neighboring VGB that is immediately to the left of the current VGB. AIL #6 is driven by either the Z or the Y DC driver of the neighboring VGB that is immediately to the left of the current VGB. AIL #5 is driven by either the X or the W DC driver of the next, not immediately-neighboring VGB that is to the left of the current VGB. AIL #4 is driven by either the Z or the Y DC driver of the next-adjacent VGB that is to the left of the current VGB.

Each of MIL's 0–6 is loaded by essentially the same number of 19 PIP's that form the corresponding 19:1 multiplexer. As such, there is roughly a same amount of signal propagation delay in going through each such multiplexer to the corresponding LUT. There is some additional delay or loading from PIP's and POP's that form the intervening decoder layer between the input term acquiring multiplexers and the LUT's of the respective CBB. A representative part of that decoder layer is shown at 523.

Note that for each of AIL's 0–55 there are at least two PIP connections to two different MIL's, one of which is placed in the MIL# 1–3 set and another of which is in general, differently placed in the MIL# 4–6 set. In other words, there are at least two possible MIL's which can be used to acquire an input term signal moving along a given AIL and feed the acquired signal to one or the other of two possible LUT's ('a' or 'b'). Thus if one of the two 19:1 multiplexers that can couple to a given AIL is already consumed, or the corresponding LUT is already consumed, the FPGA configuring software has the possibility of alternatively using the other multiplexer and/or LUT for implementing a circuit chunk that requires a particular input term signal moving along the given AIL.

Each of AIL's #54 and #55 has at least three PIP connections to a respective three different MIL's. Feedback signals from the f1 and f2 lines of the X CBB output therefore have 3 possible ways of being transmitted into the respective MIL 1–6 inputs of any one of the X, Z, W, and Y Configurable Building Blocks of the same VGB. These MIL 1–6 inputs are alternatively named as CBE(a0)In, CBE(a1) In, CBE(a2)In, CBE(b0)In, CBE(b1)In, and CBE(b2)in FIG. 5A. Note that CBE(b0)In is different from the others in that a POP (Programmable Opening Point) is provided for it in decoder section 523. CBB(ab) represents an intercepted signal that may be used for compounding or folding together the 'a' and 'b' parts of the corresponding CBB. Such compounding is beyond the focus of the present disclosure and will not be described further except to mention that it enables the conversion of two 3-input LUT's ('a' and 'b') into a 4-input or higher LUT.

Note also that in the case where the PIP's of the signal-acquiring multiplexers of FIG. 5A are of the bidirectional type (e.g., FIGS. 3B or 3C), simultaneous activation of two or more PIP's on a same AIL (during FPGA configuration time), creates a bidirectional strapping interconnection between the corresponding MIL's of those PIP's. Such a use of the PIP's of the signal-acquiring multiplexers of FIG. 5A provides a 'through-the-AIL strapping' function which is again beyond the focus of the present disclosure and will not be described further.

The basic message of FIG. 5A as presented here is to identify the AIL numbers of different kinds of interconnect lines and to show how such AIL's (adjacent interconnect lines) can supply data and/or controls to each CBB. The same AIL numbers are used in next-described FIGS. 5B–5E.

Figure 5B:
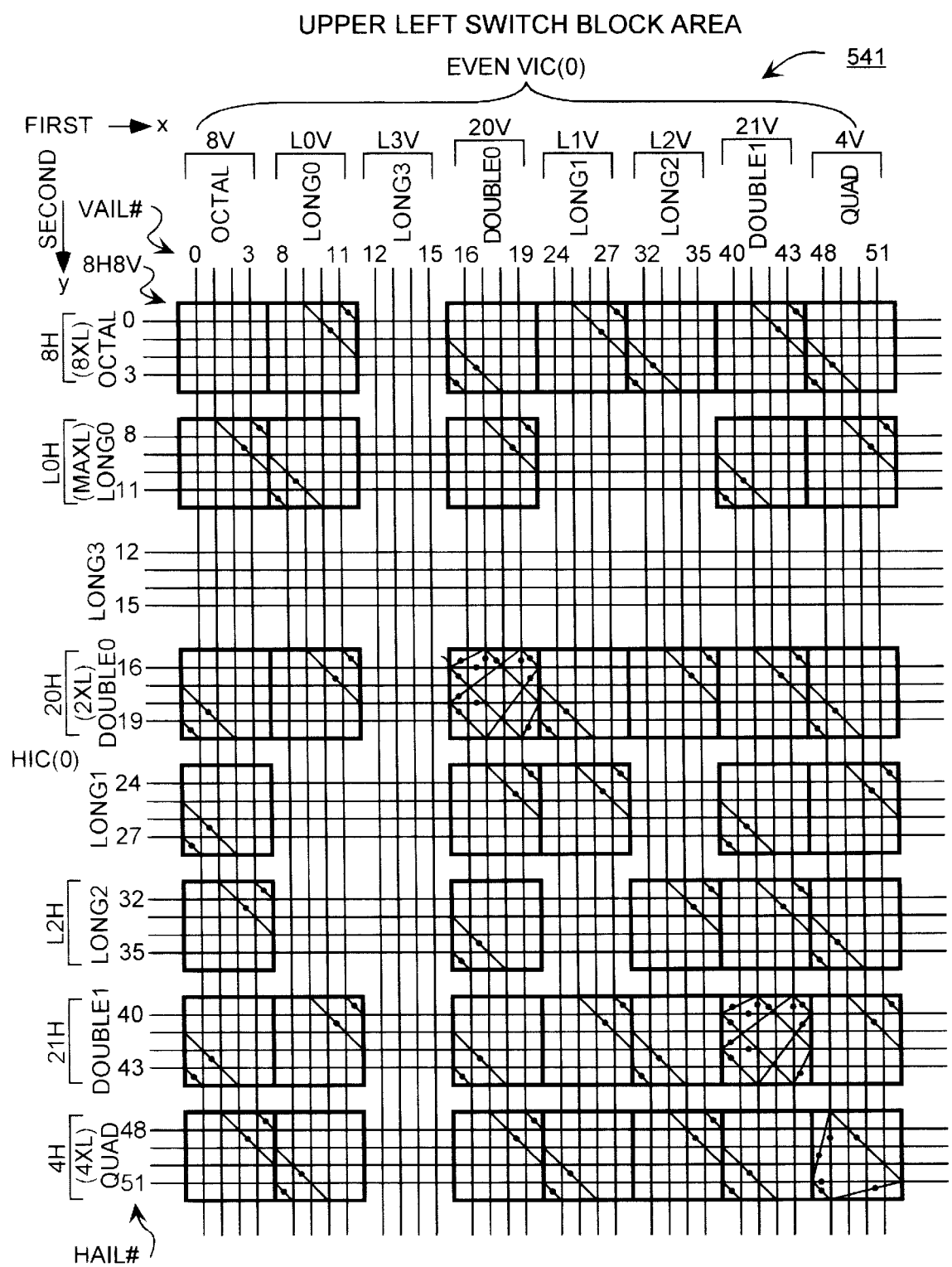
FIGS. 5B–5E respectively diagram NW, NE, SE, and SW switchbox areas of one embodiment of FIG. 4.

FIG. 5B is a schematic of one embodiment 541 of SBA 441 (NorthWest) of FIG. 4. This SBA 541 forms at each intersection of an even-numbered vertical interconnect channel (e.g., VIC(0)) with an even-numbered horizontal interconnect channel (e.g., HIC(0)). Strapping PIP's (e.g., those such as the boosted transmission gate 398 of FIG. 3C) are represented by darkened circles. AIL's that have no PIP on them are understood to pass continuously through the switchbox area without terminating at a PIP. The sub-area where the horizontal octal-length nibble bus crosses with the vertical octal-length nibble bus is referenced as 8H8V. Note that there are no PIP's in sub-area 8H8V. This is so because in FIG. 2B there are no octal switchboxes in even-numbered interconnect channels.

PIP's found on diagonal lines such as PIP's 0 and 1 of sub-area 8HL0V provide a path for transferring signals from one kind of line to another. PIP 0 for example may be activated to propagate a signal on VIC longline 9 to HIC octal line 2. Similarly PIP 1 may be activated during configuration time to propagate a signal on VIC longline 11 to HIC octal line 0. In one embodiment, it is preferable to propagate such cross-kind signals only in the direction from a sourcing longline (MaxL line) to another line. This is so for two reasons. First, the 2/4/8xL line drivers in VGB's are not tri-stateable, only longline drive amplifiers are tri-stateable. And it is desirable to have only tri-stateable drivers coupled for driving the longlines so that such longlines may be shared on a time-multiplexed basis by the various resources of the FPGA, namely, SVGB's, embedded SRAM blocks, and IOB's. (The IOB's allow the in-FPGA longlines to become extensions of tri-stated, external buses.) A second reason for not permitting driving of signals from 2xL, 4xL or 8xL lines to MaxL lines is that the 2/4/8xL line drivers in the VGB's are not powerful enough in that embodiment to drive the capacitive load of the MaxL lines.

On the other hand, the shared MaxL line drivers of each SVGB are powerful enough to cope with the additional load of one or a few more 2xL, 4xL or 8xL lines being added to a given longline. The longline (MaxL line) can then act as a signal-broadcasting highway and the orthogonally added 2xL, 4xL or 8xL lines can act as local exit ramps for distributing the broadcast signal to adjacent neighborhoods. In one embodiment, there are weakly-pulled up longlines around the periphery of the chip that are driven by the IOB's. These special longlines are referred to as NOR lines because they can be used to implement wired NOR functions. Both the NOR lines and the regular longlines are tri-stateable. The 2xL, 4xL and 8xL lines are on the other hand generally not tri-stateable by virtue of the 2/4/8xL drivers that are couplable to them. However, the 2xL, 4xL and 8xL lines can be made tri-stateable extensions of longlines as seen by sub-areas such as 8HL0V, L0H8V, 20HL0V, and 4HL0V.

Orthogonal interconnections may be made between 2xL, 4xL and 8xL lines that are not being driven by tristate drivers. Examples of such orthogonal interconnection options are seen in sub-areas such as 8H20V, 8H4V, 4H21V, and 4H4V.

Note that the vertical and horizontal, max-length nibble buses identified as Long3 (L3V and L3H) have no PIP's breaking them up or branching from them in the SBA. Each branching off PIP such as those in sub-area 8HL0V add capacitive loading to the respectively attached lines (e.g., VAIL #9 and HAIL #2 in the case of sub-area 8HL0V). Max-length nibble buses L3V and L3H are spared from having such added loading.

Each 2 PIP sub-area such as 8HL0V may be considered as a 2-PIP switchbox. There are other kinds as well.

An example of a 12 PIP switchbox is seen in sub-area 20H20V (the crossing of the Double0 nibble buses). Another such 12 PIP switchbox is seen in sub-area 21H21V. Note that every other 2xL line terminates at a PIP. HAIL #16 (horizontal adjacent interconnect line number 16) terminates in sub-area 20H20V while HAIL #17 passes through. VAIL #17 terminates in sub-area 20H20V while VAIL #16 passes through.

An example of a 6 PIP switchbox is seen in sub-area 4H4V. Note that one of every four 4xL lines terminates at a PIP. HAIL #51 terminates in sub-area 4H4V while HAIL's #48, #49, #50 pass through. VAIL #48 terminates in sub-area 4H4V while HAIL's #49, #50 and #51 pass through.

Figure 5C:
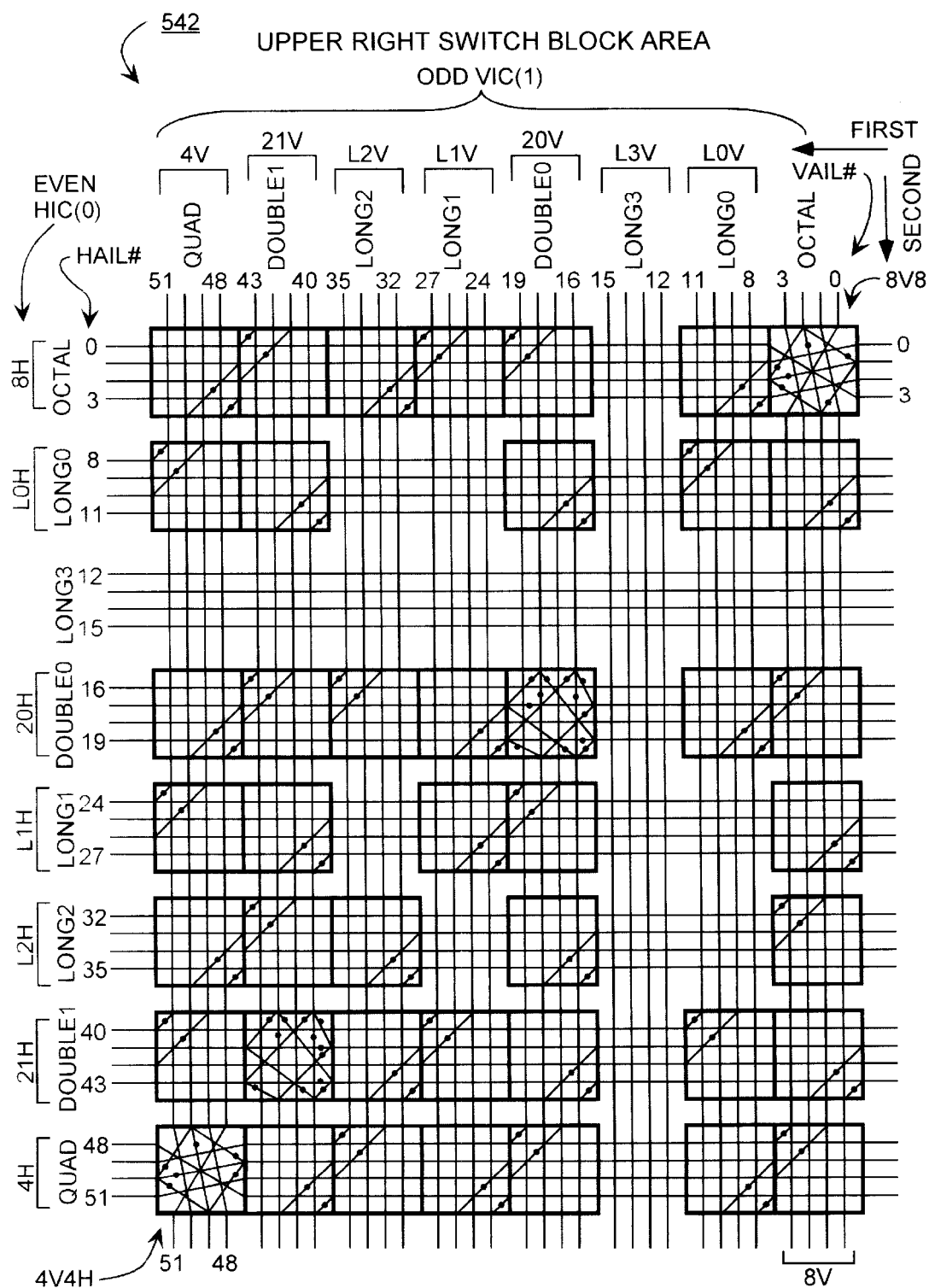

FIG. 5C is a schematic of one embodiment 542 of SBA 442 (NorthEast) of FIG. 4. This SBA 542 forms at each intersection of an odd-numbered vertical interconnect channel (e.g., VIC(1)) with an even-numbered horizontal interconnect channel (e.g., HIC(0)). As in FIG. 5B, strapping PIP's (e.g., those such as the boosted transmission gate 398 of FIG. 3C) are represented by darkened circles. AIL's that have no PIP on them are understood to pass continuously through the switchbox area without terminating at a PIP.

Note that unlike FIG. 5B (SBA 541), there are PIP's in sub-area 8V8H. This is so because in FIG. 2B there are octal switchboxes in odd-numbered interconnect channels.

Note further that VAIL numbers run right to left in FIG. 5C instead of left to right as in FIG. 5B.

There is one more oddity in FIG. 5C, sub-areas 8V8H and 4V4H 'braid' the respective HAIL's and VAIL's running through them. The quad-length nibble buses and octal-length nibble buses may be viewed as 3-dimensional tubular structures that undergo a one step 'twist' or braiding action as they pass through odd-numbered channels. More specifically, note in FIG. 5C that a signal entering from the left on HAIL #1 is braided in sub-area 8V8H to emerge on the right on HAIL #0. Similarly, a signal entering from the left on HAIL #2 is braided in sub-area 8V8H to emerge on the right on HAIL #1 if it passes through the intervening PIP. in sub-area 8V8H. A signal entering from the left on HAIL #3 is braided in sub-area 8V8H to emerge on the right on HAIL #2. A signal entering from the left on HAIL #0 is braided in sub-area 8V8H to emerge on the right on HAIL #3.

A similar process occurs in the vertical direction. A signal entering from the top on VAIL #1 is braided in sub-area 8V8H to emerge on the bottom on VAIL #0. A signal entering from the top on VAIL #2 is braided in sub-area 8V8H to emerge on the bottom on VAIL #1 if it passes through the intervening PIP in sub-area 8V8H. A signal entering from the top on VAIL #3 is braided in sub-area 8V8H to emerge on the bottom on VAIL #2. A signal entering from the top on VAIL #0 is braided in sub-area 8V8H to emerge on the bottom on VAIL #3. As mentioned above, similar horizontal and vertical braiding operations occur in sub-area 4V4H.

Braiding provides a number of benefits. It rotates signals circumferentially through the hypothetical, 3D tubular structures of the quad-length nibble buses and the octal-length nibble buses so that a same signal may be accessed from differently numbered AIL's by corresponding CBB's (see FIG. 5A). It allows a same output connection pattern to be used by the 2/4/8xL drivers of each CBB because a signal output by a like 2/4/8xL driver in a nearby CBB will have rotated due to braiding so as to avoid contention. It provides a same repeatable pattern for chip layout. It provides a same repeatable pattern for analysis by FPGA synthesis software. The latter helps to speed the processing time of the FPGA synthesis software so that users can have more time for physical testing after each iterative reconfiguration of the target FPGA.

Note that there is no braiding in the double-length nibble buses. The 2xL lines terminate each at both ends in either odd-numbered channels or in even-numbered channels.

Figure 5D:
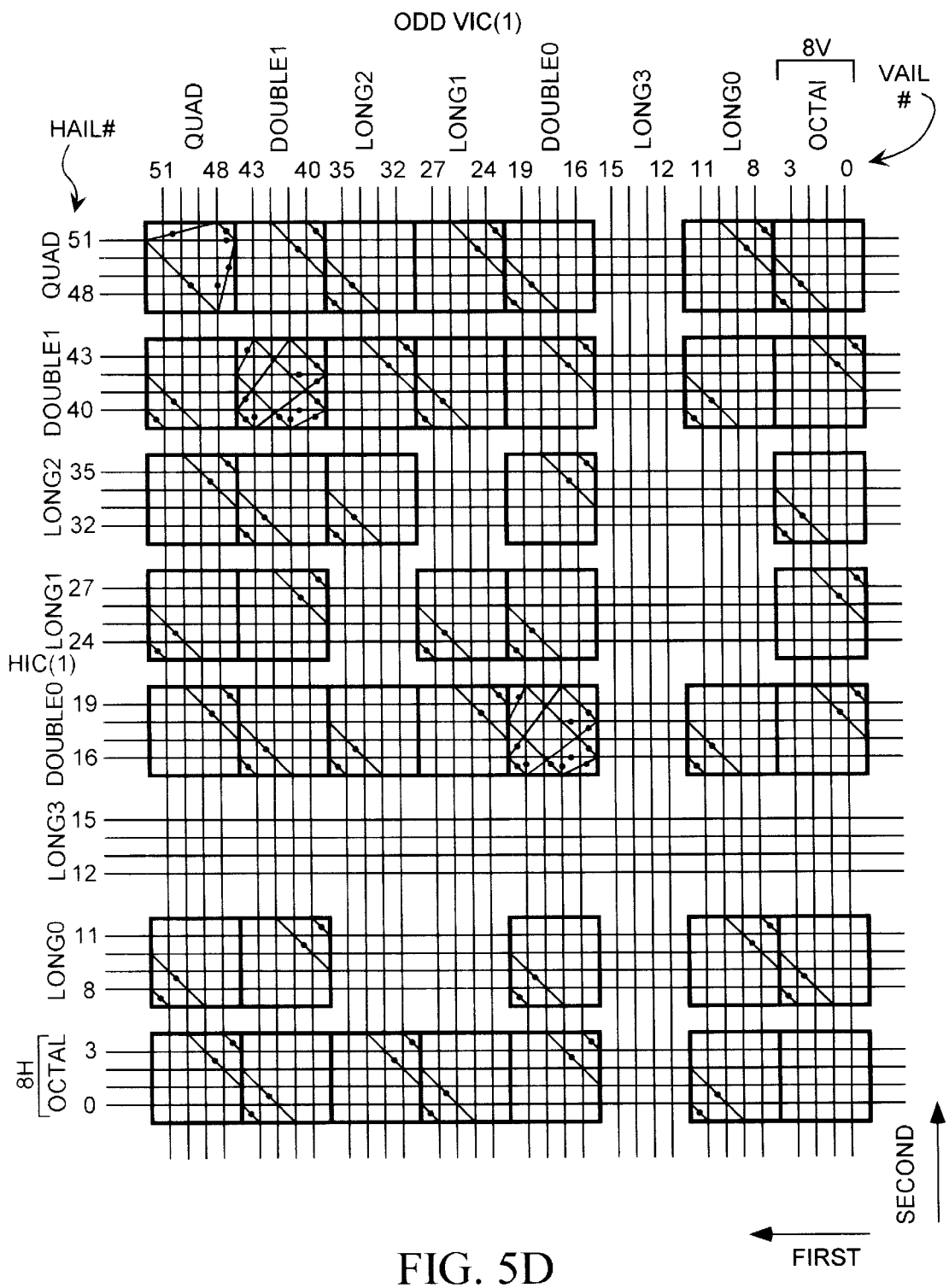

FIG. 5D is a schematic of one embodiment 544 of SBA 444 (SouthEast) of FIG. 4. This SBA 544 forms at each intersection of an odd-numbered vertical interconnect channel (e.g., VIC(1)) with an odd-numbered horizontal interconnect channel (e.g., HIC(1)). SBA 544 is essentially a mirror image about the tile diagonal with SBA 541. Note that VAIL numbers run right to left in FIG. 5D instead of left to right as in FIG. 5B. Note further that HAIL numbers run bottom to top in FIG. 5D instead of top to bottom as in FIG. 5B.

Figure 5E:
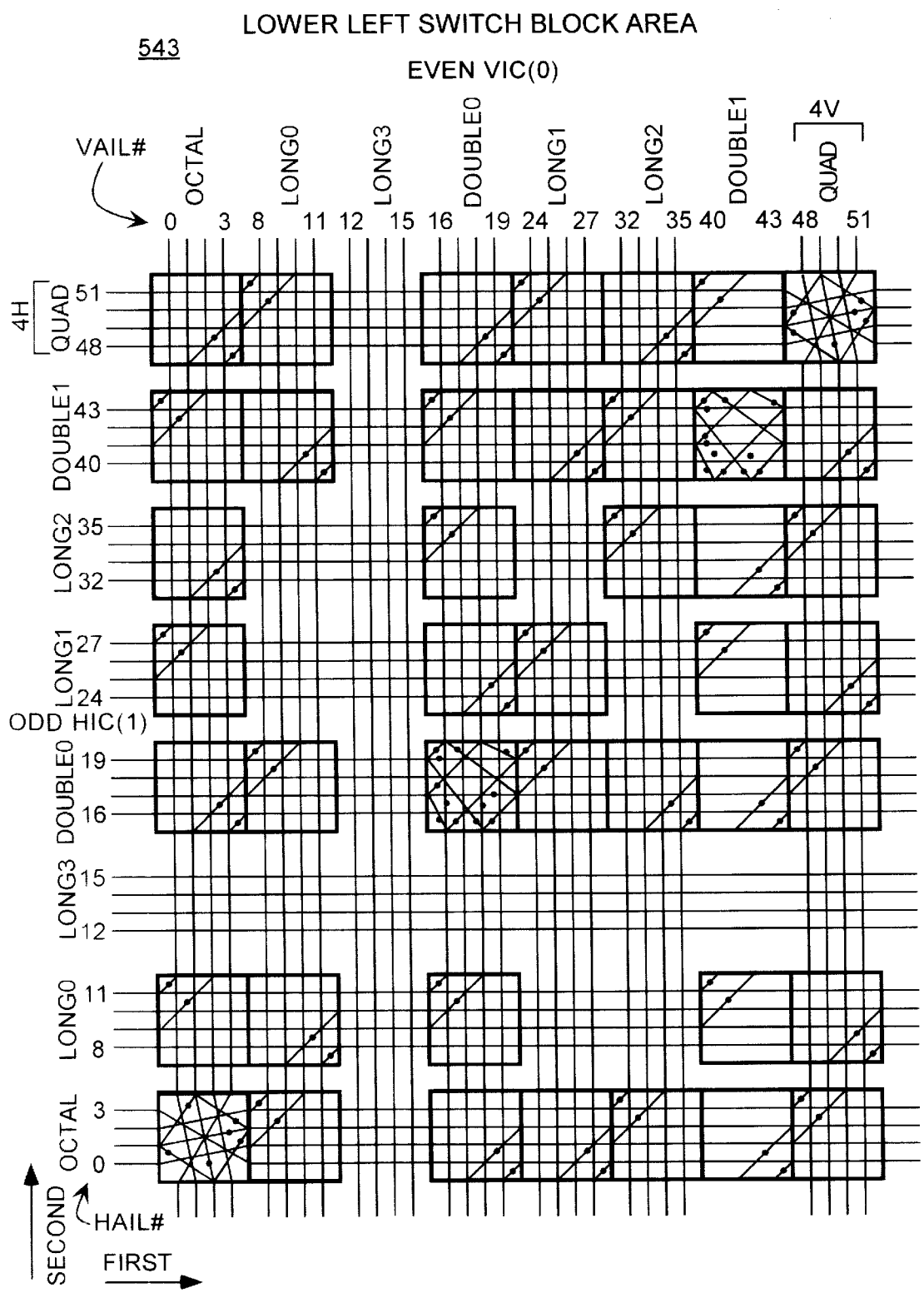

FIG. 5E is a schematic of one embodiment 543 of SBA 443 (SouthWest) of FIG. 4. This SBA 543 forms at each intersection of an even-numbered vertical interconnect channel (e.g., VIC(0)) with an odd-numbered horizontal interconnect channel (e.g., HIC(1)). SBA 543 is essentially a mirror image about the tile diagonal with SBA 542. Note that VAIL numbers run left to right as in FIG. 5B. Note further that HAIL numbers run bottom to top as in FIG. 5D. Braiding is seen at sub-areas 4V4H and 8V8H.

Figure 6:
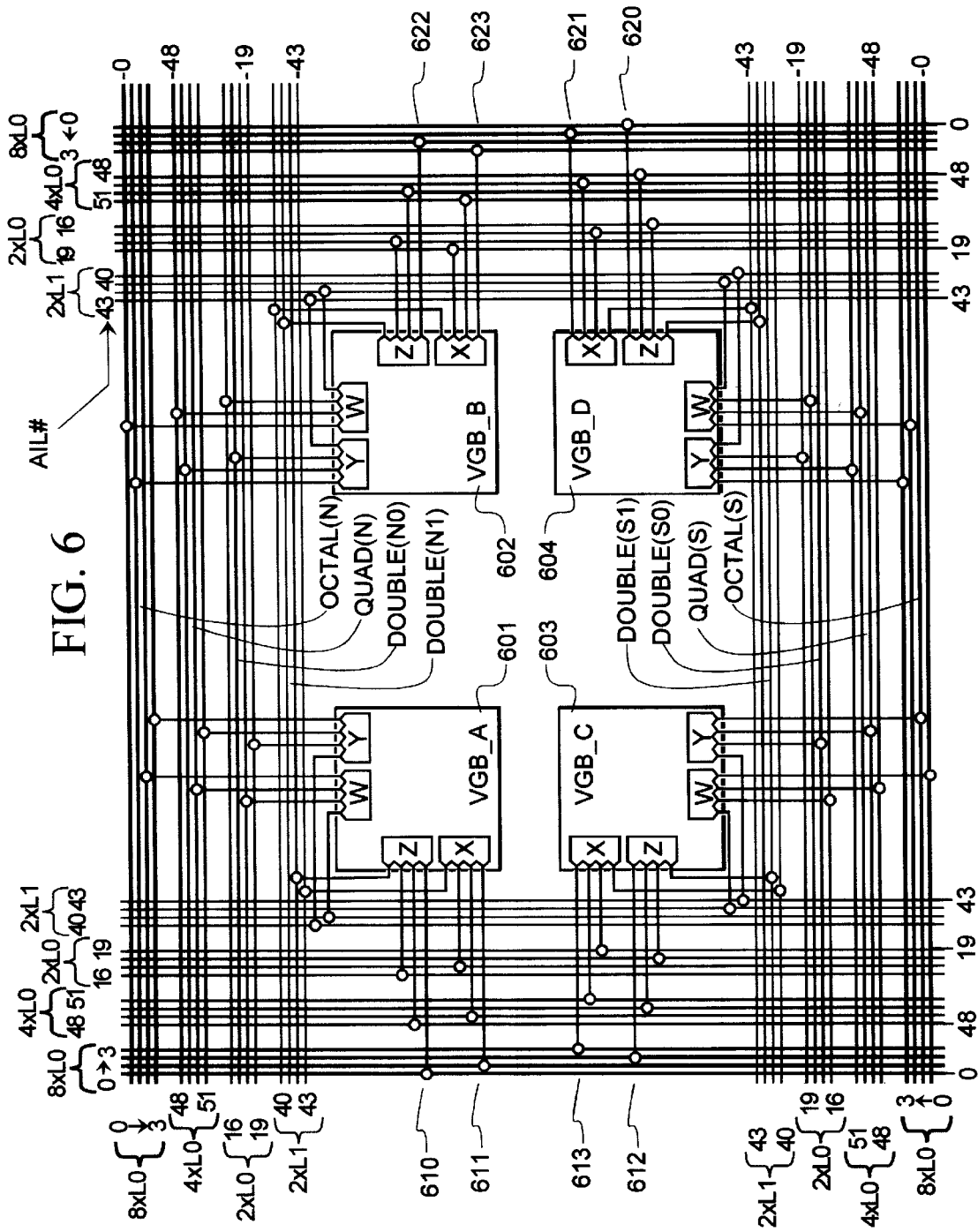
FIG. 6 illustrates how the 2/4/8xL output lines of respective CBB's (X, Z, W, Y) within a SVGB are configurably couplable to surrounding interconnect channels.

FIG. 6 looks at the 2/4/8xL driver output connections for each super-VGB. In FIG. 6, each CBB has four respective output lines for driving nearby 2xL interconnect lines, 4xL interconnect lines and 8xL interconnect lines that surround the encompassing super-VGB. The four respective output lines of each CBB may all come from one internal 2/4/8xL line driving amplifier or from different drive amplifiers.

The layout of FIG. 6 is essentially symmetrical diagonally as well as horizontally and vertically. The octal length (8xL) lines are positioned in this embodiment further away from the VGB's 600–603 than are the 4xL and 2xL lines of the respective vertical and horizontal interconnect channels. AIL line #0 of each of the illustrated VIC's and HIC's is at the outer periphery and AIL numbers run generally from low to high as one moves inwardly. The quad length (4xL) lines are positioned in this embodiment further away from the VGB's than are the double length (2xL) lines of the respective VIC's and HIC's. It is within the contemplation of the invention to alternatively position the octal length (8xL) lines closest to VGB's 600–603, the quad length (4xL) lines next closest, and the double length (2xL) lines of the respective VIC's and HIC's furthest away from surrounded VGB's 600–603. The same pattern of course repeats in each super-VGB of the FPGA core matrix.

VGB_A (600) can couple to same AIL's in the northern octals (Octals(N)) as can VGB_D (603) in the southern octals (Octals(S)). A similar, diagonal symmetry relation exists between VGB_B (601) and VGB_C (602). Symmetry for the eastern and western octal connections is indicated by PIP's 610, 611, 613 and 612 moving southwardly along the west side of the tile and by counterposed PIP's 620, 621, 623 and 622 moving northwardly along the east side.

Note that the non-adjacent 2xL connections of this embodiment (e.g., the PIP connection of the Y CBB in 1600 to vertical AIL #40) allow for coupling of a full nibble of data from any VGB to the 2xL lines in either or both of the adjacent VIC's and HIC's. Thus, bus-oriented operation may be efficiently supported by the L-organized CBB's of each VGB in either the horizontal or vertical direction. Each CBB of this embodiment has essentially equivalent access to output result signals to immediately adjacent 2xL, 4xL and 8xL lines as well as to nonadjacent 2xL lines (in the AIL 40–43 sets). Each pair of VGB's of a same row or column can output 4 independent result signals to a corresponding 4 lines in any one of the following 4-line buses: (a) the immediately adjacent 2xL0 group (AIL's 16–19), (b) the immediately adjacent 4xL group (AIL's 48–51), (c) the immediately adjacent 8xL group (AIL's 0–3), and (d) the not immediately adjacent 2xL1 group (AIL's 40–43).

Due to the braiding that occurs within the embodiments of FIGS. 5B–5E in odd-channels for the quad-length nibble buses and octal-length nibble buses the VGB_A (600) of two adjacent SVGB's may simultaneously output data onto the adjacent 4xL or 8xL lines without contention.

Figure 7A:
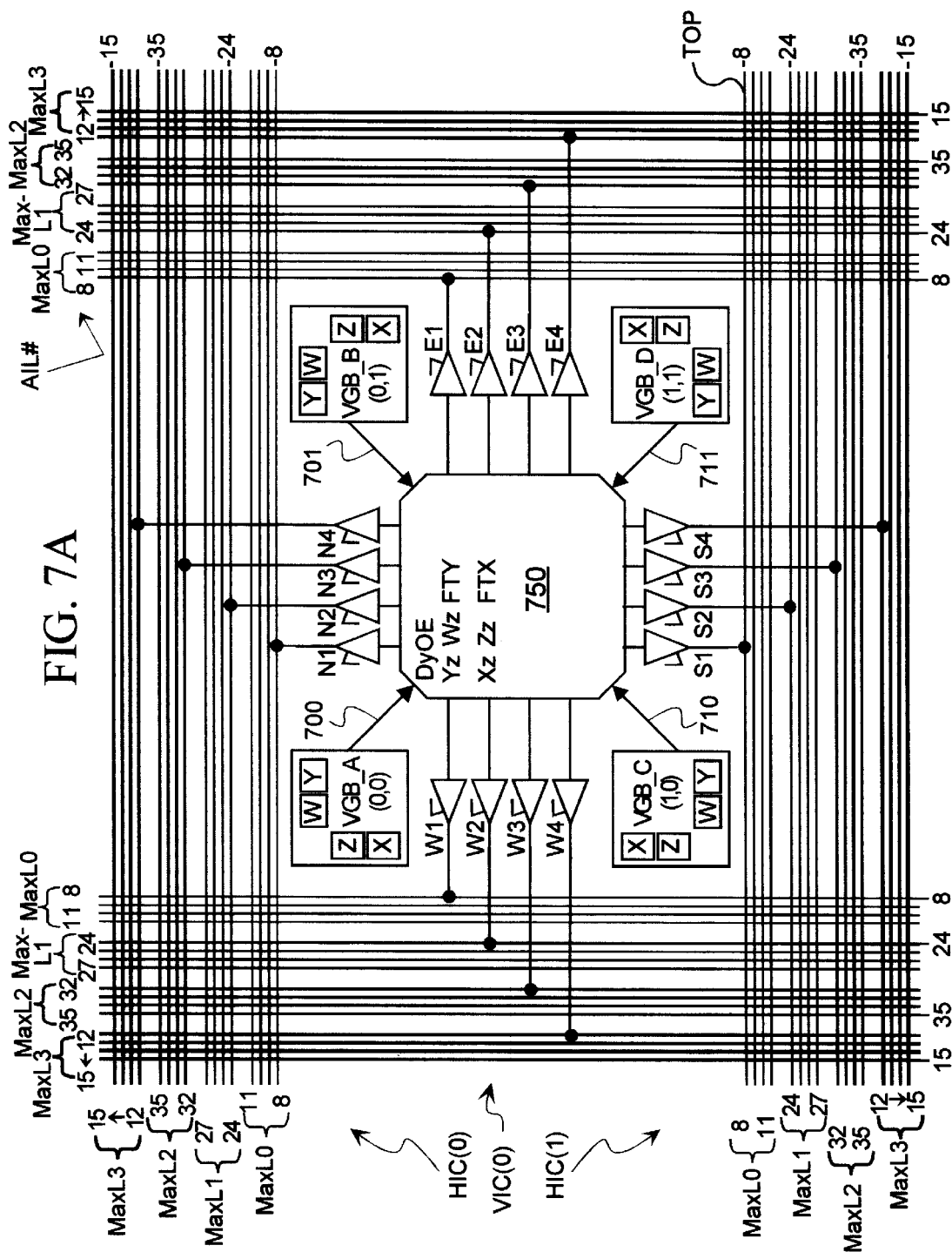
FIGS. 7A–7D illustrate how the MaxL line drivers of respective SVGB's are coupled to surrounding interconnect channels.

Aside from having dedicated 2/4/8xL drivers in each CBB, there are shared big drivers (tri-stateable MaxL drivers) at the center of each super-VGB for driving the MaxL lines of the surrounding horizontal and vertical interconnect channels (HIC's and VIC's). Referring to FIG. 7A, a scheme for connecting the shared big drivers (MaxL drivers) to the adjacent MaXL interconnect lines is shown for the case of super-VGB (0,0). This super-VGB (also shown as 101 in FIG. 2A) is surrounded by horizontal interconnect channels (HIC's) 0 and 1 and by vertical interconnect channels (VIC's) 0 and 1. The encompassed VGB's are enumerated as A=(0,0), B=(0,1), C=(1,0) and D=(1,1). A shared big logic portion of the SVGB is shown at 750. Shared big logic portion receives input/control signals 700, 701, 710, 711 and responsively sends corresponding data and control signals to sixteen, three-state (tristate) longline driving amplifiers that are distributed symmetrically relative to the north, east, south and west sides of the SVGB. The sixteen, tristate drivers are respectfully denoted as: N1 through N4, E1 through E4, S1 through S4, and W1 through W4. Angled line 700 represents the supplying of generically-identified signals: DyOE, Yz, Wz, Xz, Zz, FTY(1,2) and FTX(1,2) to block 750 from VGB_A. DyOE is a dynamic output enable control. Yz, Wz, Xz, Zz are respective result signals from the Y, W, X, Z CBB's of VGB_A. FTY(1,2) and FTX(1,2) are feedthrough signals passed respectively through the Y and X CBB's of VGB_A. Angled lines 701, 710 and 711 similarly and respectively represent the supplying of the above generically-identified signals to block 750 from VGB_B, VGB_C and VGB_D.

Note that the tristate (3-state) nature of the shared big drivers means that signals may be output in time multiplexed fashion onto the MaxL lines at respective time slots from respective, bus-mastering ones of the SVGB's along a given interconnect channel.

The adjacent MaxL interconnect lines are subdivided in each HIC or VIC into four groups of 4 MaxL lines each. These groups are respectively named MaxL0, MaxL1, MaxL2 and MaxL3 as one moves radially out from the core of the super-VGB. MaxL drivers N1 through N4 respectively connect to the closest to the core, lines of respective groups MaxL0, MaxL1, MaxL2 and MaxL3 of the adjacent north HIC.

MaxL drivers E1 through E4 similarly and respectively connect to the closest to the core ones of MaxL lines in respective groups MaxL0–MaxL3 of the adjacent east VIC. MaxL drivers S1 through S4 similarly and respectively connect to the closest to the core ones of MaxL lines in respective groups MaxL0–MaxL3 of the adjacent south HIC. MaxL drivers W1 through W4 similarly and respectively connect to the closest to the core ones of MaxL lines in respective groups MaxL0–MaxL3 of the adjacent west vertical interconnect channel (VIC(0)).

As one steps right to a next super-VGB (not shown), the N1–N4 connections move up by one line in each of the respective groups MaxL0–MaxL3, until the top most line is reached in each group, and then the connections wrap around to the bottom most line for the next super-VGB to the right and the scheme repeats.

A similarly changing pattern applies for the southern drives. As one steps right to a next super-VGB (not shown), the S1–S4 connections move down by one line in each of the respective groups MaxL0–MaxL3, until the bottom most line is reached in each group, and then the connections wrap around to the top most line for the next super-VGB to the right and the scheme repeats.

A similarly changing pattern applies for the eastern and western drives. As one steps down to a next super-VGB (not shown), the E1–E4 and W1–W4 connections move outwardly by one line in each of the respective groups MaxL0–MaxL3, until the outer most line is reached in each group, and then the connections wrap around to the inner most line of each group for the next super-VGB down and the scheme repeats.

Figure 7B:
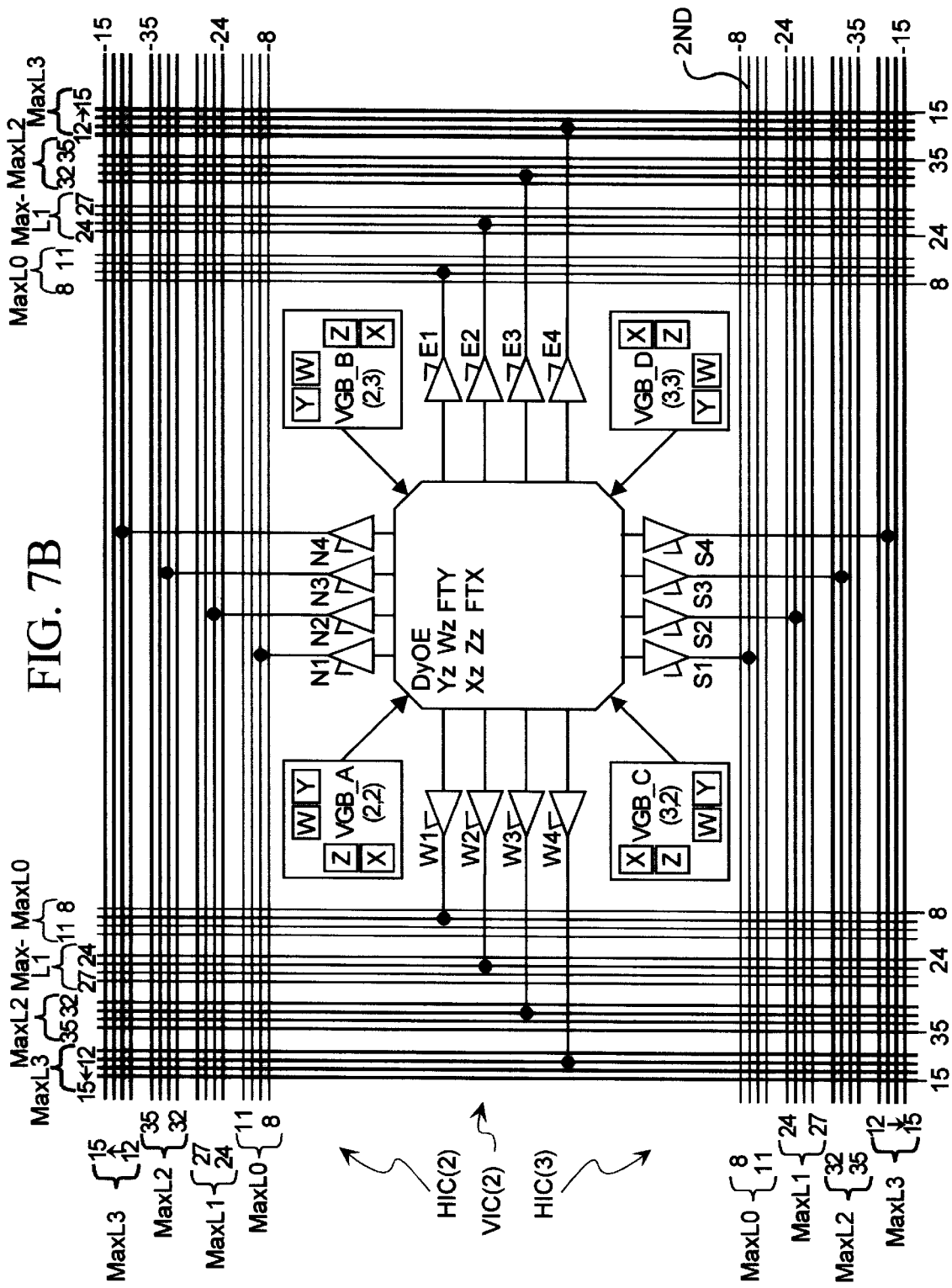

FIG. 7B shows a sampling of this out-stepping pattern of connections for the super-VGB surrounded by HIC's 2 and 3 and by VIC's 2 and 3. The encompassed VGB's are enumerated as A=(2,2), B=(2,3), C=(3,2) and D=(3,3).

Figure 7C:
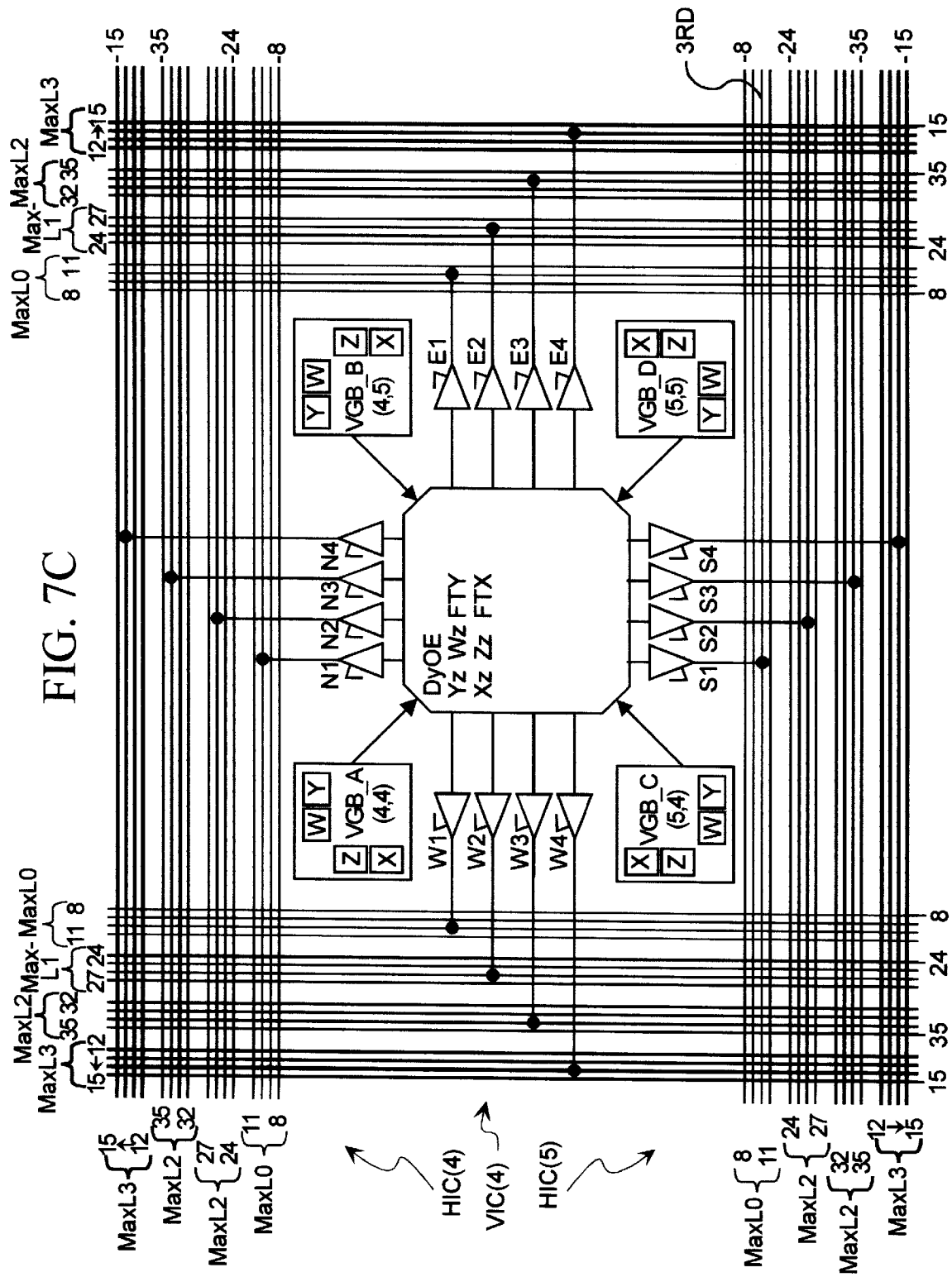

FIG. 7C shows a sampling of this out-stepping pattern of connections for the next super-VGB along the diagonal, which super-VGB is surrounded by HIC's 4 and 5 and by VIC's 4 and 5. The encompassed VGB's are enumerated as A=(4,4), B=(4,5), C=(5,4) and D=(5,5).

Figure 7D:
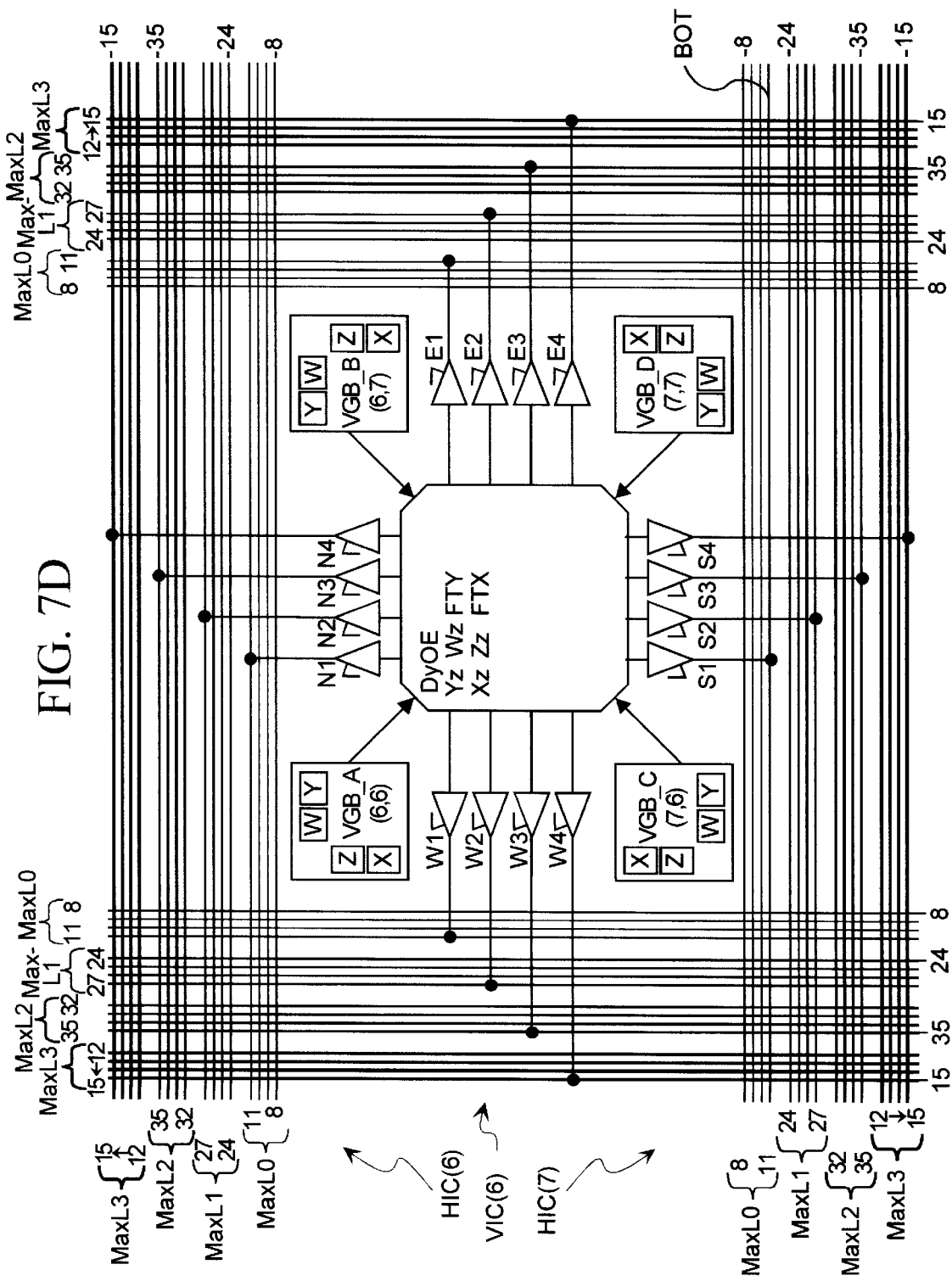

FIG. 7D shows a sampling of this out-stepping pattern of connections for the next super-VGB along the diagonal, which super-VGB is surrounded by HIC's 6 and 7 and by VIC's 6 and 7. The encompassed VGB's are enumerated as A=(6,6), B=(6,7), C=(7,6) and D=(7,7).

The combination of FIGS. 7A–7D demonstrates how all 16 MaxL lines of a given HIC can be driven by the northern or southern MaxL drivers of a horizontal succession of four super-VGB's. The combination of FIGS. 7A–7D also demonstrates how all 16 MaxL lines of a given VIC can be driven by the eastern or western MaxL drivers of a vertical succession of four super-VGB's. Bus-wide operations can be supported for nibble-wide buses by just one super-VGB acting as the bus driver. Bus-wide operations can be supported for byte-wide buses by a pair of super-VGB's acting as bus master. Bus-wide operations can be supported for 16 bit-wide buses by a quadruple of super-VGB's acting as bus master. For wider buses, the driving super-VGB's can be configured to behave as dynamic multiplexers that provide time-multiplexed sharing of the adjacent MaxL lines. For example, each of the X, Z, W, and/or Y CBB's of each longline-driving super-VGB can be configured as a 4:1 multiplexer by configuring each 3-input LUT 'a' and 'b' as a 2:1 dynamic multiplexer and then folding together the two 2:1 multiplexers. The respective output signals Xz, Zz, Wz, and/or Yz of these CBB's can then drive the shared big drives to provide neighboring VGB's with time shared access to the driven longlines of the respective, longline-driving super-VGB.

Note that there is a same number (e.g., 16) of MaxL drivers as there are CBB's (X,Z,W,Y times 4) within each super-VGB. The combination of FIGS. 7A–7D provides a structure through which CBB result signals may be configurably routed to the longlines (MaxL lines) of either one of orthogonal interconnect channels, or alternatively, simultaneously broadcast to the longlines of such orthogonal interconnect channels.

The group of MaxL lines in each channel that are driven by tristate drivers of FIG. 7A are referred to herein as the 'TOP' set. This TOP set comprises AIL's #8, #24, #32 and #12 of respective groups MaxL0, MaxL1, MaxL2 and MaxL3. (The designation of this set as being TOP is arbitrary and coincides with the label TOP in the right bottom corner of FIG. 7A as applied to the bottom MaxL0 group.)

In similar fashion, the group of MaxL lines in each channel that are driven by tristate drivers of FIG. 7B are referred to herein as the '2ND' set. This 2ND set comprises AIL's #9, #25, #33 and #13. The group of MaxL lines in each channel that are driven by tristate drivers of FIG. 7C are referred to herein as the '3RD' set. This 3RD set comprises AIL's #10, #26, #34 and #14. The group of MaxL lines in each channel that are driven by tristate drivers of FIG. 7D are referred to herein as the 'BOT' set. This BOT set comprises AIL's #11, #27, #35 and #15.

Figure 7E:
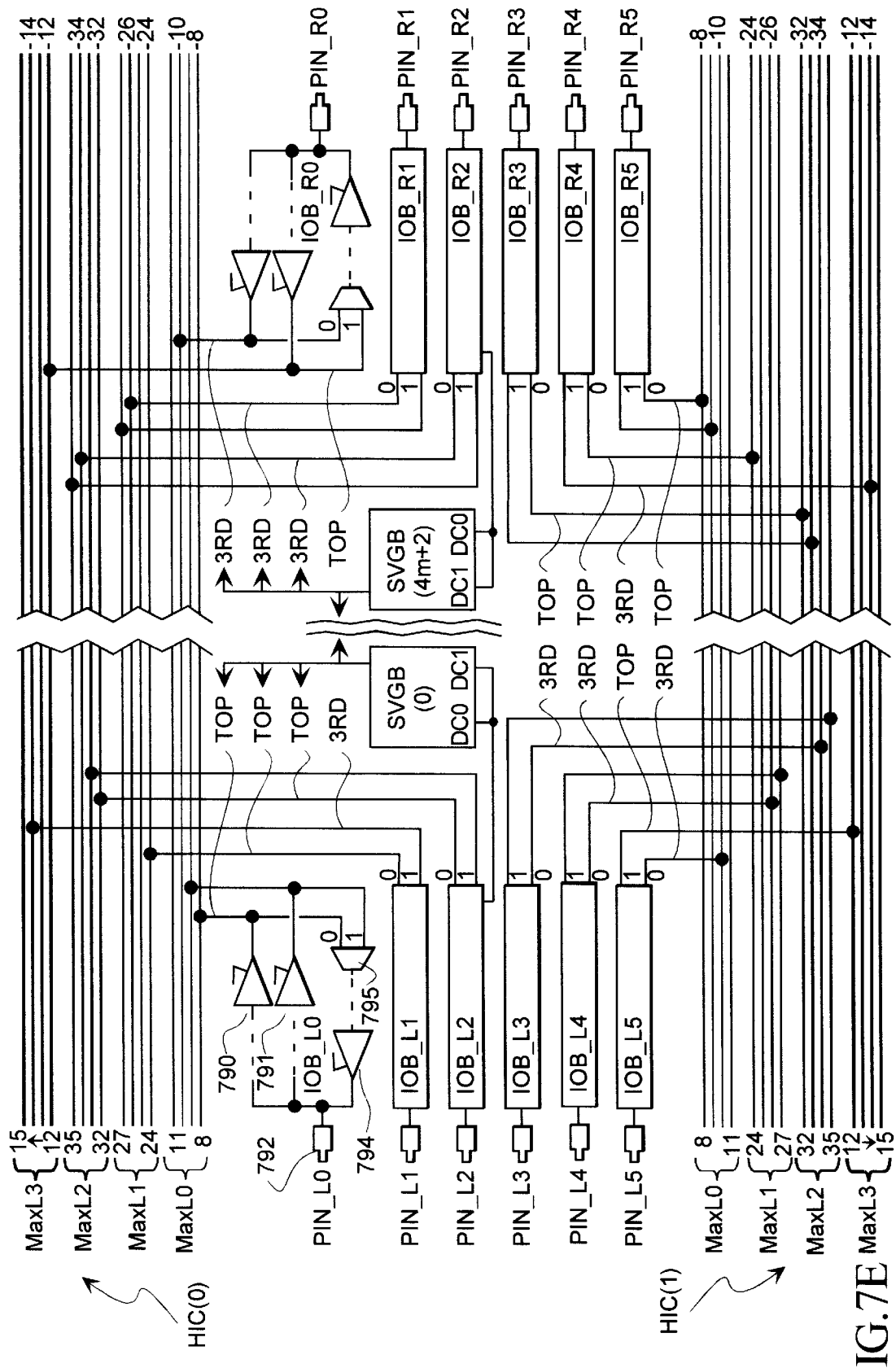
FIG. 7E illustrates how the MaxL line drivers of respective IOB's are coupled to surrounding interconnect channels.

FIG. 7E illustrates how IOB's interface with the MaxL lines, and in particular the TOP set of AIL's #8, #24, #32 and #12; and the 3RD set of AIL's #10, #26, #34 and #14.

Internal details of each IOB are not germane to the present disclosure and are thus not fully shown. As seen in FIG. 7E however, each IOB such as IOB_L0 (at the top, left) includes two longline driving tristate drivers 790 and 791 for driving a respective pair of MaxL lines. The illustrated tristate drivers 790 and 791 for example, respectively drive TOP AIL #8 and 2ND AIL #9. Input signals of the respective two longline driving tristate drivers, 790 and 791, may be configurably derived from a number of sources including external I/O pin 792 of the FPGA device 100. (Other sources include one or both of two bypassable and serially-coupled registers {not shown} within each IOB.)

Each IOB such as IOB_L0 further includes a pin-driving tristate driver (with configurably-variable slew rate) such as shown at 794. Input signals of the pin-driving tristate driver 794 may be configurably derived from a number of sources including from user-configurable multiplexer 795. Two of the selectable inputs of multiplexer 795 are coupled to the same two longlines driven by that same IOB. In the case of IOB_L0 for example, that would be TOP AIL #8 and 2ND AIL #9.

The remaining IOB's shown in FIG. 7E have similar internal structures, which structures are not further detailed herein. As seen, at the left side of the FPGA device 100 between even-numbered HIC(0) and odd-numbered HIC(1), there are provided six IOB's respectively identified as IOB_L0 through IOB_L5. At the right side of the FPGA device 100 there are further provided six more IOB's respectively identified as IOB_R0 through IOB_R5. The external I/O pins are similarly identified as PIN_R0 through PIN_R5 on the right side and as PIN_L0 through PIN_L5 on the left side. The same connection pattern repeats between every successive set of even and odd-numbered HIC's. FIG. 7E may be rotated ninety degrees to thereby illustrate the IOB-to-MaxL lines connectivity pattern for the VIC's as well. (References to horizontal lines will of course be changed to vertical and references to left and right IOB's will of course be changed to top and bottom.)

On the left side, IOB_L0, IOB_L1 and IOB_L2 collectively provide bidirectional coupling at least to 3 TOP longlines (AIL's #8, #24, #32) and 1 3RD longline (AIL #14) in the adjacent even-numbered HIC(0). On the right side, IOB_R0, IOB_R1 and IOB_R2 collectively provide bidirectional coupling at least to 3 3RD longlines (AIL's #10, #26, #34) and 1 TOP longline (AIL #12) in the adjacent and same even-numbered HIC(0). The combination of the six IOB's of HIC(0) therefore allow for bidirectional coupling of nibble-wide data either to the TOP set ((AIL's #8, #24, #32 and #12) and/or to the 3RD set (AIL's #10, #26, #34 and #14).

As seen in the bottom half of FIG. 7E, on the left side, IOB_L5, IOB_L4 and IOB_L3 collectively provide bidirectional coupling at least to 3 3RD longlines (AIL's #10, #26, #34) and 1 TOP longline (AIL #12) in the adjacent odd-numbered HIC(1). On the right side, IOB_R5, IOB_R4 and IOB_R3 collectively provide bidirectional coupling at least to 3 TOP longlines (AIL's #8, #24, #32) and 1 3RD longline (AIL #14) in the same odd-numbered HIC(1). The combination of the six IOB's of HIC(1) therefore allow for bidirectional coupling of nibble-wide data either to the TOP set (AIL's #8, #24, #32 and #12) and/or to the 3RD set (AIL's #10, #26, #34 and #14) of the odd-numbered, adjacent HIC.

In addition to the above-described couplings between the IOB's and the MaxL lines of the interconnect mesh, IOB's also couple by way of direct connect wires to peripheral ones of the SVGB's for both input and output. More specifically, there are direct connect wires connecting the left-side IOB's (IOB_L0 through IOB_L5) to adjacent SVGB's of super column number 0. Two such wires are represented as DC1 and DC2 coupling IOB_L2 to the illustrated column-0 SVGB. The same SVGB(0) corresponds to that of FIG. 7A insofar as driving the longlines of the adjacent HIC. FIG. 7E indicates that these super column 0 SVGB's can drive the same TOP set of longlines (AIL's #8, #24, #32 and #12) that may be driven by the IOB's.

There are further direct connect wires connecting the right-side IOB's (IOB_R0 through IOB_R5) to adjacent SVGB's of the rightmost super column. The column number of the rightmost super column is preferably (but not necessarily) equal to an even integer that is not a multiple of four. In other words, it is equal to 4m+2 where m=1, 2, 3, etc. and the leftmost super column is numbered 0. That means there are a total of 4m+3 SVGB's per row. The latter implies that square SVGB matrices will be organized for example as 11×11, 13×13, 19×19, 23×23 SVGB's and so on. (If the same organizations are given in terms of VGB's, they become 22×22, 26×26, 38×38, 46×46 VGB's and so on.) In such cases, the rightmost SVGB, number(4m+2) will corresponds to that of FIG. 7C insofar as driving the longlines of the adjacent HIC is concerned. The same rightmost SVGB number(4m+2) connects by way of direct connect wires to the right-side IOB's. FIG. 7E indicates that these super column number 4m+2 SVGB's can drive the same 3RD set of longlines (AIL's #10, #26, #34 and #14) that may be driven by the IOB's, and as will later be seen, by the embedded memory.

In alternate embodiments, the extent of direct connect between IOB's to adjacent columns of SVGB's is increased from extending to just the most adjacent super column to extending to at least the first two or three nearest super columns. This allows the right-side IOB's to reach the SVGB's that drive the 3RD longline set with direct connections.

Aside from direct connect wires, IOB's may be further coupled to the SVGB's of the device by 2xL, 4xL, 8xL lines of the adjacent HIC's. Coupling between the IOB's and the 2xL, 4xL, 8xL lines of adjacent HIC's may be provided through a configurable dendrite structure that extends to the multiplexer 795 of each IOB from pairs of adjacent HIC's. The specific structure of such configurable dendrite structures (not shown) is not germane to the present disclosure. It is sufficient to understand that configurable coupling means are provided for providing coupling between the 2xL, 4xL, 8xL lines of the adjacent HIC's and the corresponding IOB's.

Figure 8:
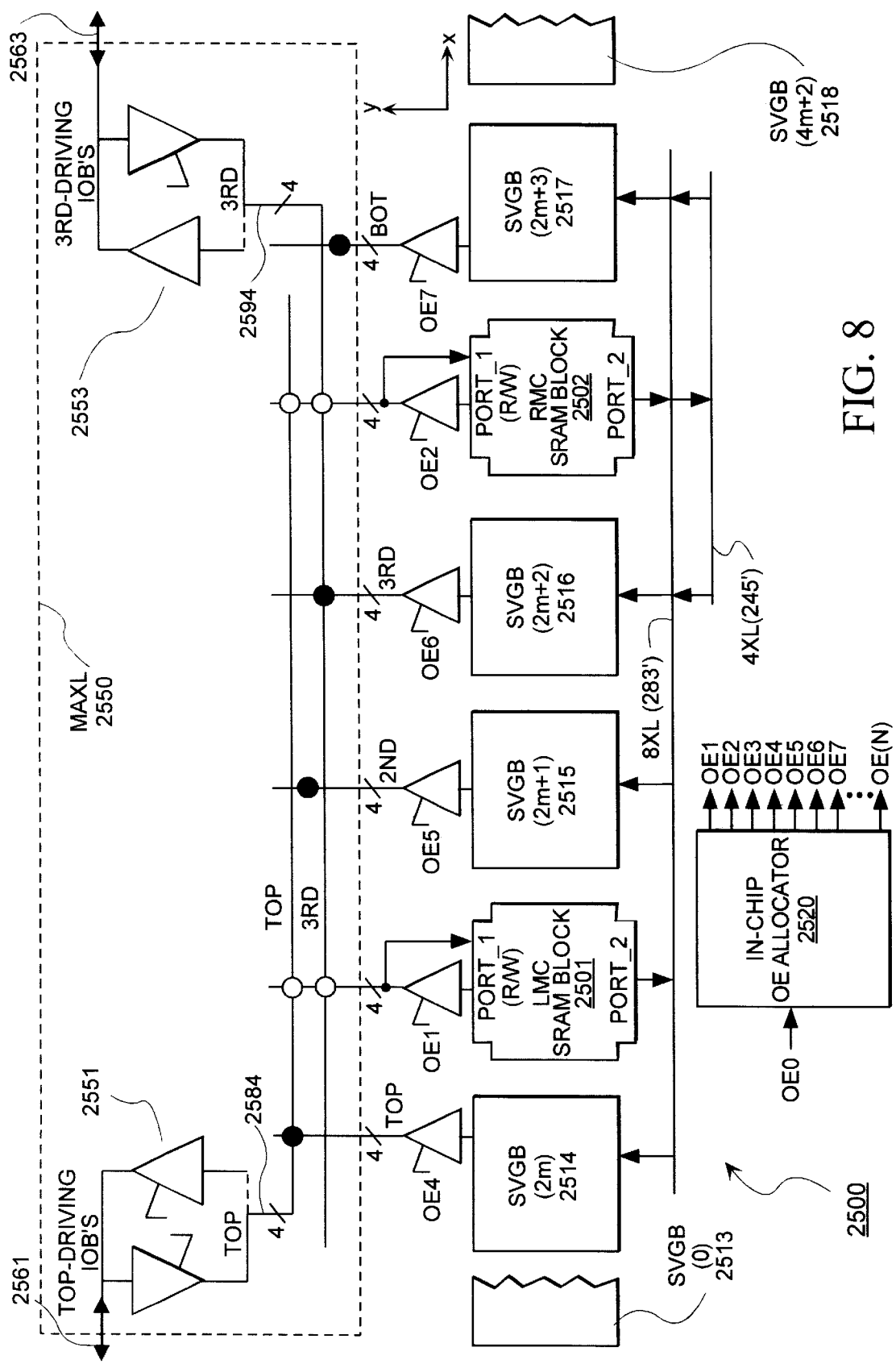
FIG. 8 diagrams a configuration wherein a bidirectional interconnect bus that extends out of the FPGA device is shared by plural blocks of embedded memory through first ports (RW ports) thereof while memory stored data is transferred at high-speed out of second ports (RO ports) thereof by way of shorter interconnect lines.

FIG. 8 provides another view of an FPGA chip 2500 conforming to the above principles. A MaxL lines portion of a given HIC is shown within dashed box 2550. Portion 2550 includes TOP longline set 2584 (4 MaxL lines) and 3RD longline set 2594 (another 4 MaxL lines). A first set of four IOB's is denoted at 2551 as TOP-driving IOB's. Each such TOP-driving IOB has a tristate longline driver for driving a chip-external signal onto respective MaxL line of the TOP longline set 2584. Each such TOP-driving IOB further has a tristate external-line driver for driving a chip-internal signal onto respective line of an external bus 2561. The TOP-driving IOB's 2551 can be configured so that the TOP longline set 2584 can function as a bidirectional extension of four respective lines of the chip-external bus 2561.

A second set of four IOB's is denoted at 2553 as 3RD-driving IOB's. Each such 3RD-driving IOB has a tristate longline driver for driving a chip-external signal onto respective MaxL line of the 3RD longline set 2594. Each such TOP-driving IOB further has a tristate external-line driver for driving a chip-internal signal onto respective line of a second external bus 2563. The 3RD-driving IOB's 2553 can be configured so that the 3RD longline set 2594 can function as a bidirectional extension of four respective lines of the second chip-external bus 2563. The first and second chip-external buses, 2561 and 2563 may each be part of a wider outside-the-chip bus, in which case the combination of TOP longline set 2584 and 3RD longline set 2594 can function as a bidirectional extension of the outside-the-chip bus, 2561/2563.

Tristate longline drivers of respective SRAM blocks 2501 (LIMC) and 2502 (RMC) are shown outside their SRAM blocks for purposes of explanation. Tristate longline drivers of respective SVGB's 2514–2517 are also shown outside their SVGB's for purposes of explanation. These drivers each correspond to elements N1–N4 of FIGS. 7A–7D.

It is assumed that there is a total of 4m+3 SVGB's in each row of FPGA chip 2500, where m is an integer greater than zero. SVGB 2513 is the leftmost one of its respective super row and is numbered as SVGB(0). SVGB 2518 is the rightmost one of the same super row and is numbered as SVGB(4m+2). SVGB 2515 is approximately the rightmost one of the left half of the super row and is numbered as (2m+1). SVGB 2516 is the approximately the leftmost one of the right half of the super row and is thus numbered as (2m+2). SVGB's 2514 and 2517 are correspondingly numbered as (2m) and (2m+3). SRAM block 2501 is located between SVGB's 2514 and 2515. SRAM block 2502 is located between SVGB's 2516 and 2517.

The illustrated example assumes that SVGB(0) 2514 drives the TOP longline set. SVGB's numbered as 4, 8, . . . 4m therefore also drive the TOP longline set. The shared tristate longline drivers (N1–N4) of SVGB 2514 are therefore shown coupled to the TOP longline set 2584 in accordance with FIG. 7A. Similarly, the shared tristate longline drivers (N1–N4) of SVGB 2515 couple to the 2ND longline set in accordance with FIG. 7B, the shared tristate longline drivers (N1–N4) of SVGB 2516 couple to the 3RD longline set 2594 in accordance with FIG. 7C, and the shared tristate longline drivers (N1–N4) of SVGB 2517 couple to the BOT longline set in accordance with FIG. 7D. The Port_1 tristate longline drivers of LMC SRAM block 2501 and RMC SRAM block 2502 are configurably couplable to either of the TOP and 3RD longline sets, 2584 and 2594.

Output enabling lines of the tristate longline drivers of SVGB's 2514–2517 are respectively identified as OE4–OE7. Output enabling lines of the tristate longline drivers of SRAM blocks 2501 and 2502 are respectively identified as OE1 and OE2. As seen in FIG. 8, because any one of SRAM blocks 2501, 2502 or any one of 50t of the SVGB's in the row (e.g., SVGB(0), SVGB(2), . . . SVGB (2m), SVGB(2m+2), . . . SVGB(4m+2)) can become a bus master over at least one of the TOP and 3RD longline sets, 2584 and 2594, some means should be provided for determining which one is bus master at which point in time. Such a means is identified in the example of FIG. 8 as an in-chip OE allocator 2520. OE allocator 2520 may activate a respective two of output enabling lines OE1–OE(N) for picking the respective bus master of the TOP and 3RD longline sets, 2584 and 2594. OE allocator 2520 may further activate a respective two of output enabling lines OE3–OE(N−1) for picking the respective bus master of the 2ND and BOT longline sets, where OE3 (not shown) is an output enabling line of a device that can master the 2ND or BOT longline set.

The in-chip OE allocator 2520 may be implemented by in-chip VGB's or SVGB's that drive either horizontal or vertical buses for distributing the respective output enabling signals, OE1–OE(N). For SVGB's having shared control sections such as Crtl of FIG. 4, the corresponding DyOE signal (see FIGS. 7A–7D) may be configurably acquired from either one of an adjacent HIC or a VIC.

In cases where the chip-internal, TOP and 3RD longline sets, 2584 and 2594 are serving as extensions of respective chip-external buses, 2561 and 2563, a time slot allocating signal OE0 will typically be supplied to the OE allocator 2520 to indicate that—as opposed to giving control to an external bus master—one of the longline driving resources within the FPGA chip 2500 may become master over the overall bus (which bus extends both inside and outside chip 2500). The internal-enabling signal, OEO may be sourced from outside chip 2500 or may be developed within chip 2500 and sent out to let external devices know when chip 2500 is asserting mastery over the overall bus (e.g., 2561 plus 2584).

It can be appreciated that buses 2584 and/or 2594 may be congested with heavy data traffic, and that as a result, each of SRAM blocks 2501 and 2502 may have barely enough time slots allocated to them for importing data (writing data) into their respective memory arrays, let alone for exporting stored data out to the shared buses 2584 and/or 2594. It can be seen however, that Port_2 connections to 2xL, 4xL, or 8xL lines of the same HIC may serve as high-speed backdoors by way of which memory stored data can be read out more quickly for use by neighboring SVGB's. The illustrated example shows 8xL line 283' (see also FIG. 2B) being shared on a time-multiplexed basis by the tri-stateable Port_2's of the LMC SRAM block 2501 and of the RMC SRAM block 2502 for transferring stored data to any one or more of SVGB's 2514–2517. Additionally, or alternatively, a 4xL line such as 245' may be used for quickly transferring stored data from a single one of the SRAM blocks (e.g., 2502) to immediately neighboring SVGB's (such as 2516 and 2571 for the case of RMC SRAM block 2502).

One contemplated usage method has each of SRAM blocks 2501 and 2502 functioning as a FIFO for acquiring raw data in appropriate time slots from outside FPGA chip 2500 by way of IOB's 2551 and/or 2553 and respective buses 2584 and/or 2594. The so acquired and stored data is then passed on to available SVGB's in FIFO style via the backdoor pathways (283' or 245') for subsequent processing. The SVGB's (2514–2517) have internal registers in which they may store result data produced from such processing. When an appropriate time slot is signaled to each such SVGB (2514–2517) by its respective output enabling signal (OE4–OE7), the register-stored, result data of that SVGB may be output onto the time-multiplexed bus (2561/2584 and/or 2594/2563) for acquisition by a subsequent processing unit. The subsequent processing unit may be yet another chip-internal SVGB that can acquire data from the MaxL lines 2550 or a chip-external device (e.g., another like FPGA device) that can acquire data from the chip external buses 2561 and/or 2563.

The above disclosure is to be taken as illustrative of the invention, not as limiting its scope or spirit. Numerous modifications and variations will become apparent to those skilled in the art after studying the above disclosure.

By way of example, instead of having only two columns of embedded memory respectively designated for the TOP longline set and the 3RD longline set, it is also within the contemplation of the invention to provide four columns of embedded memory respectively designated for the TOP through 3RD longline sets. Different numbers of columns of embedded memory may also be provided. Also, nibble-wide orientation may replaced by orientation for 8-bit data words and paths or 16-bit data words and paths or larger by making corresponding and matched changes to the Variable Grain Architecture (VGA) and the Variable Length Interconnect Architecture (VLI).

In summation it has been shown how a field-programmable gate array device (FPGA) may be organized with symmetrical and complementary Variable Grain Architecture (VGA) and Variable Length Interconnect Architecture (VLI). It has been shown how synthesis mapping may exploit the diversified and symmetric resources of the VGA and VLI to efficiently pack function development into logic units of matched granularity without area wastage. It has been shown how to transfer signals between logic units with interconnect lines of minimal length without excessive wire length wastage.

Given the above disclosure of general concepts, principles and specific embodiments, the scope of protection sought is to be defined by the claims appended hereto.

What is claimed is:

1. A method for configuring an FPGA device having plural variable grain blocks (VGB's) each including wedged-together, fine grained, function-imrDlementingq constructs and overlapping coarse grained, function-implementing constructs, and the FPGA device further having diversified VGB interconnect resources, wherein said diversified VGB interconnect resources include: non-global, maximum length lines; short-haul, general interconnect lines that sean a distance of at least two VGB's: and intermediate length lines that are shorter than the non-global, maximum length lines but lonaer than said short-haul, general interconnect lines and the FPGA device further having for each VGB local feedback lines which are each dedicated to providing intraconnect within the respective VGB; said configuring method comprising:

(a) mapping synthesis definitions to fit within the fine or coarse arained constructs of the variable grain blocks (VGB's) of the FPGA device; and (b) rearranging the mapped constructs to increase nucleated function development within the VGB's, as opposed to maximizing cascaded function development through use of multiple ones of the VGB's and use of said intermediate lenath lines or maximum length lines for the same function development, said increase of nucleated function development operating to reduce utilization of said VGB interconnect due to cascaded development of functions through multiple VGB's.

2. The FPGA configuring method of claim 1 wherein said rearranging of the mapped constructs comprises:

(b.1) finding cascaded function developments; and (b.2) changing said cascaded function developments into nucleated function developments to an extent allowed by the coarse grained, function-implementing constructs of the VGB's.

3. The FPGA configuring method of claim 2 wherein each VGB includes a plurality of Configurable Building Blocks (CBB's) each having programmably-configurable, function developing resources that can be programmably folded-together to provide coarser function development, and wherein said rearranging of the mapped constructs further comprises:

(b.3) maximizing folded-together utilization of the function developing resources within a given one or more of said CBB's.

4. The FPGA configuring method of claim 2 wherein each VGB includes programmably-configurable, function developing resources that can be programmably folded-together to provide coarser function development, and wherein said rearranging of the mapped constructs further comprises:

(b.3) maximizing folded-together utilization of the function developing resources within a given one or more of said VGB's.

5. The FPGA configuring method of claim 4 wherein adjacent ones of said VGB's can be programmably folded-together to provide yet coarser function development, and wherein said rearranging of the mapped constructs further comprises:

(b.3) maximizing folded-together utilization of the function developing resources of adjacent ones of said VGB's by programmably folding-together said adjacent VGB's.

6. The FPGA configuring method of claim 5 wherein said, foldable-together, adjacent ones of the VGB's are wedged together so as not have intervening interconnect channels passing therebetween.

7. The FPGA configuring method of claim 1 wherein said diversified VGB interconnect resources further include a plurality of programmable switchboxes having resources for providing programmably-configurable interconnection between respective ones of said short-haul, general interconnect lines and intermediate length lines, and wherein said configuring method further comprises:

(c) placing signal-sharing ones of the mapped constructs in adjacent VGB's so as to reduce, in subsequent inter-VGB signal routing usage of the switchbox resources for said function developments of increased nucleation.

8. The FPGA configuring method of claim 1 wherein said diversified VGB interconnect resources further include a plurality of programmable switchboxes having resources for providing programmably-configurable interconnection between respective ones of said short-haul, general interconnect lines and intermediate length lines, wherein said diversified VGB interconnect resources further include direct connect lines (DCL's) that each provide dedicated interconnection between a respective, signal sourcing VGB a plurality of other VGB's, said DCL's not needing switchboxes to provide their respective, dedicated interconnections, and wherein said configuring method further comprises:

(c) placing signal-sharing ones of the mapped constructs in directly-connected ones of said VGB's so as to reduce, in subsequent inter-VGB signal routing usage of the switchbox resources for said function developments of increased nucleation.

9. A method for configuring an FPGA having plural variable grain blocks (VGB's) each including granulatable, coarse function-implementing constructs that can be programmably granulated into non-overlapping finer grained, function-implementing constructs, and the FPGA further having diversified VGB interconnect resources, wherein said diversified VGB interconnect resources include: short-haul, general interconnect lines that span a distance of at least two VGB's but less than that of a row of VGB's; and intermediate length lines that are shorter than said row of VGB's but longer than said short-haul, general interconnect lines, and the FPGA further having for each VGB local feedback lines which are each dedicated to providing intraconnect within the respective VGB and between said coarse and finer grained, function-implementing constructs of the VGB; said configuring method comprising:

(a) mapping synthesis definitions to fit within the fine and coarse grained constructs of the variable grain blocks (VGB's) of the FPGA device; and (b) congregating the mapped constructs to increase nucleated function development within the VGB's, said increase of nucleated function development operating to reduce utilization of said VGB interconnect resources due to cascaded development of functions through multiple VGB's.

10. A reconfigurable FPGA provided in an integrated circuit and comprising:

(a) a plurality of variable grain blocks (VGB's) each including fine grained, function-implementing constructs and overlapping coarse grained, function-implementing constructs;

(b) diversified VGB interconnect resources, wherein said diversified VGB interconnect resources include:

(b. 1) non-global, maximum length interconnect lines;

(b.2) short-haul, general interconnect lines that span a distance of at least two VGB's; and (b.3) intermediate length interconnect lines that are shorter than the non-global, maximum length interconnect lines but longer than said short-haul, general interconnect lines;

(c) a plurality of tristateable line drivers coupled to drive respective ones of said interconnect lines, each tristateable line driver having an output enable terminal for selectively enabling the driver to drive a respective one of said interconnect lines, (c.1) where plural ones of said interconnect lines can each be driven by multiple ones of said tristateable line drivers; and (d) an output enable allocator operatively coupled to the respective output enable terminals of the multiple tristateable line drivers of a given one or more of said plural interconnect lines for selecting as a line master, one of the multiple tristateable line drivers of each of the given one or more of said plural interconnect lines.

* * * * *